United States Patent [19]

Henschenp et al.

[11] Patent Number: 5,059,756

[45] Date of Patent: Oct. 22, 1991

[54] SELF REGULATING TEMPERATURE HEATER WITH THERMALLY CONDUCTIVE EXTENSIONS

[75] Inventors: Homer E. Henschenp, Carlisle; Michael J. McKee, New Cumberland; Joseph M. Pawlikowski, Lancaster, all of Pa.

[73] Assignee: AMP Incorporated, Harrisburg, Pa.

[21] Appl. No.: 277,116

[22] Filed: Nov. 29, 1988

[51] Int. Cl.⁵ ............................................. B23K 1/00
[52] U.S. Cl. ............................ 219/85.22; 219/85.18; 219/85.16; 219/85.11; 219/553
[58] Field of Search ................. 219/85.1, 85.18, 85.22, 219/85.16, 535, 553, 209; 439/835; 29/860, 191.6; 228/180.2

[56] References Cited

U.S. PATENT DOCUMENTS

| | | |
|---|---|---|
| 3,396,894 | 8/1968 | Ellis . |
| 3,719,981 | 3/1973 | Steitz ................................. 29/423 |
| 3,750,252 | 8/1973 | Landman ......................... 29/191.6 |
| 4,256,945 | 3/1981 | Carter ............................. 219/10.75 |
| 4,354,629 | 10/1982 | Grassauer ............................ 228/56 |
| 4,484,704 | 11/1984 | Grassauer ........................... 228/180 |
| 4,623,401 | 11/1986 | Derbyshire ........................... 148/13 |
| 4,626,767 | 12/1986 | Clappier ............................. 323/280 |
| 4,659,912 | 4/1987 | Derbyshire ......................... 219/535 |
| 4,695,713 | 9/1987 | Krumme ............................ 219/553 |
| 4,701,587 | 10/1987 | Carter ............................. 219/10.75 |
| 4,717,814 | 1/1988 | Krumme ............................ 219/553 |
| 4,745,264 | 5/1988 | Carter ............................. 219/553 |
| 4,788,404 | 11/1988 | Kent ............................... 219/85.1 |
| 4,789,767 | 12/1988 | Doljack . | |

FOREIGN PATENT DOCUMENTS

| | | |
|---|---|---|
| 0158434 | 10/1985 | European Pat. Off. . |
| 0198697 | 10/1986 | European Pat. Off. . |
| 0206620 | 12/1986 | European Pat. Off. . |
| 0241597 | 10/1987 | European Pat. Off. . |
| 0241597 | 10/1987 | European Pat. Off. . |
| 0250094 | 12/1987 | European Pat. Off. . |
| 2620619 | 12/1977 | Fed. Rep. of Germany . |

OTHER PUBLICATIONS

Standard Search Report, 9/13/89.

*Primary Examiner*—Clifford C. Shaw
*Attorney, Agent, or Firm*—David L. Smith

[57] ABSTRACT

Spaced contact pads (23,43,83,84) on a printed circuit board (19,45,85) are soldered to respective spaced contacts (21,41,51,81,82) in a cable (230,50) or connector assembly (40,80) by means of respective spaced connecting members (15,48,57,70,92,94,96,98,100,102,104,106) interposed between contacts to be soldered. The connecting members are typically electrically and thermally conductive finger-like projections formed as part of a heater body (10,60,55,47,91) and are readily severably from the heater body after soldering to thereby remain part of the final solder connection. A prescribed amount of fusible material (e.g., solder) is pre-deposited on the connecting members and/or contacts and is melted when the heater is actuated. The heater body may be a self-regulating heater in the form of a copper substrate (11,61,65) having a thin surface layer (13, 63,67) of magnetically permeable, high resistance alloy. An alternating current of constant amplitude and high frequency is passed through the heater body and is concentrated in the surface layer at temperatures below the surface layer Curie temperature. At higher temperatures the current is distributed through the lower resistance substrate to limit further heating. During the time interval required for the surface layer to reach its Curie temperature, the resistive power dissipation creates sufficient thermal energy to melt the pre-deposited solder. The connecting members are positioned and configured as necessary to reach their respective connection sites.

49 Claims, 10 Drawing Sheets

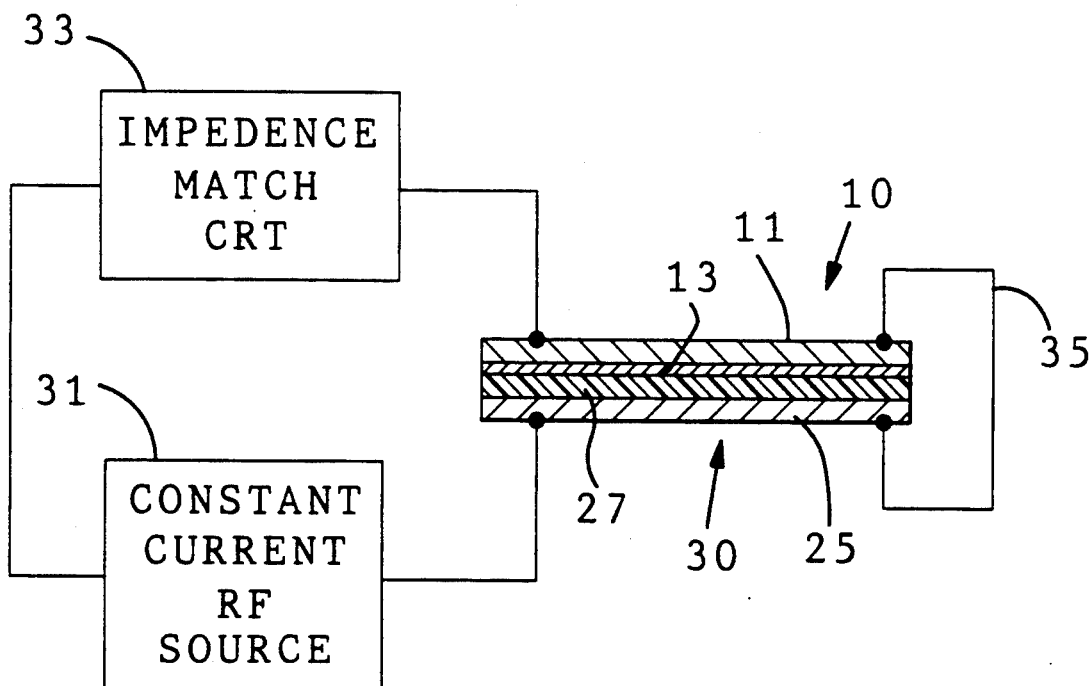
_Fig. 2B_
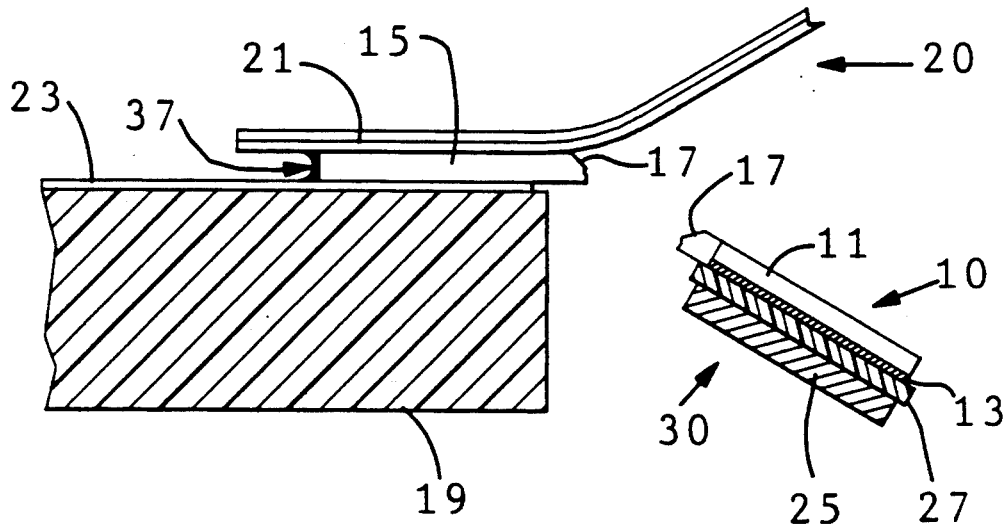
_Fig. 3_

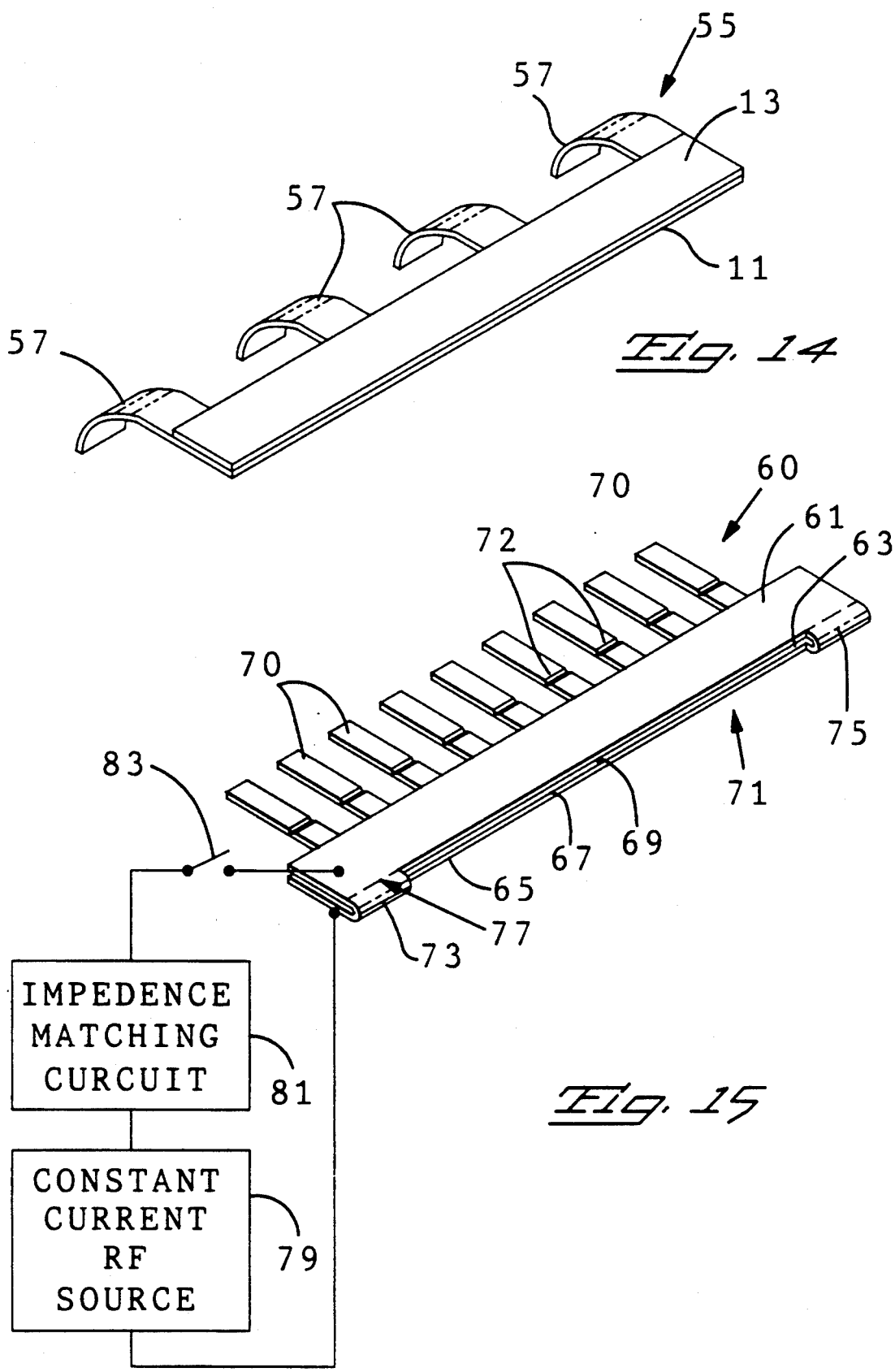

SELF REGULATING TEMPERATURE HEATER WITH THERMALLY CONDUCTIVE EXTENSIONS

BACKGROUND OF THE INVENTION

The present invention relates to a method and apparatus for soldering a first plurality of electrical contacts to a second plurality of electrical contacts. The invention has particular utility in joining flexible etched cables, ribbon cables and surface mount connectors to contact pads on printed circuit boards and may also be employed to join two single contacts instead of pluralities of contacts.

Although the invention has its primary utility in simultaneously joining first and second pluralities of contacts, it will be appreciated that the principles described herein are equally applicable to joining a single contact to another single contact. Moreover, although the description set forth below mentions solder as the joining material, it is to be understood that any fusible material, such as doped conductive plastic material, may be employed.

Soldering flat cable leads to circuit board contact pads can be achieved by a variety of prior art methods and apparatus. The least desirable of these is manually effecting each of the multiple solder terminations because the resulting repetitive soldering operations are time-consuming and costly. In addition, close spacing between adjacent connection sites renders it likely that one or more of the manual soldering operations will result in solder bridges between one or more pairs of the adjacent sites.

There have been a number of prior art attempts to solve the aforementioned problems, examples of which may be found in U.S. Pat. Nos. 3,396,894 (Ellis), 3,719,981 (Steitz), 3,750,252 (Landman) and 4,484,704 (Grassauer et al). Typically, in these and other prior art soldering procedures for forming multiple solder joints simultaneously, a soldering tool is employed to deliver the necessary thermal energy over a large continuous area spanning all of the connection sites. Upon energization, the soldering tool heats up until it overshoots a control temperature before settling down to that temperature. The control temperature is typically chosen somewhat above the ideal soldering temperature in order to compensate for less than ideal thermal energy transfer. This approach to thermal energy delivery has a number of disadvantages. One such disadvantage is damage to components resulting from overheating. For example, the thermal overshoot inherent in the heating tool can damage components disposed between the connection sites within the area heated by the tool. In some cases the overshoot may cause damage to the polymeric materials, insulating materials and adhesives at the connection site. It is tempting to suggest that the operator of the soldering tool might avoid the thermal overshoot by either removing the tool before the overshoot occurs or delaying application of the tool until after the overshoot occurs. This is impractical for a number of reasons. First, there is no evident indication as to when the thermal overshoot occurs. Second, although the tool warm-up time is quite long, the time interval during which the tool temperature is sufficient to melt solder, but prior to overshoot, is too short to reliably complete the soldering operation. Further, where the tool is also employed to apply pressure to the connection site, the power must be turned off after the solder melts while pressure is maintained on the tool until the solder solidifies. The tool must be re-energized to effect the next soldering cycle. The repeated on-off cycling changes the starting temperature for the transient overshoot in each cycle, thereby making it virtually impossible to determine when the tool attains the final control temperature.

Another prior art problem associated with the simultaneous soldering of sets of plural contacts relates to solder bridging between connection sites. The pressure and thermal energy applied to spaces between connection sites tends to cause the solder to run between those sites and form solder bridges. This problem has been addressed in some prior art apparatus such as that disclosed in the aforementioned Grassauer et al patent. In that apparatus the solder is sandwiched between two layers of polymeric material, one of which has window openings arranged to permit the solder, when melted, to flow through to respective connection sites. Barriers are provided between the windows to preclude solder bridging While this technique minimizes bridging when properly employed, proper employment is hampered by the difficulty of aligning the windows (which must necessarily face downward and away from the technician) with respective contact pads at the connection sites. Care must also be taken to avoid displacement of the solder within the layered polymeric package prior to heating the apparatus in order to assure that solder is present at each of the window openings.

It is desirable, therefore, to provide a method and apparatus that permits simultaneous soldering at multiple connection sites without applying thermal energy to spaces between those sites and without creating solder bridges between adjacent connection sites. Moreover, the method and apparatus should be equally useful in joining a single contact to another single contact. In addition, it is desirable that the thermal energy required to melt the solder be available virtually instantaneously after energization of the heater, and that the heater be arranged to provide no more thermal energy than is required to melt the solder employed for the various connection sites. Finally, it is desirable that the apparatus have relatively low mass in order that it may cool down quickly after a soldering operation.

The present invention makes use of a relatively new automatic self-regulating heater technology disclosed in U.S. Pat. Nos. 4,256,945 (Carter et al), 4,623,401 (Derbyshire et al), 4,659,912 (Derbyshire), 4,695,713 (Krumme), 4,701,587 (Carter et al), 4,717,814 (Krumme) and 4,745,264 (Carter). The disclosures in these patents are expressly incorporated herein by reference. A heater constructed in accordance with that technology, hereinafter referred to as a self-regulating heater, employs a substrate of copper, copper alloy, or other material of low electrical resistivity, negligible magnetic permeability and high thermal conductivity. A thin layer of thermally-conductive magnetic material is deposited on all or part of one surface of the substrate, the layer material typically being an iron, nickel or nickel-iron alloy, or the like, having a much higher electrical resistance and magnetic permeability than the substrate material. The thickness of the layer is approximately one skin depth, based on the frequency of the energizing current and the permeability and resistance of the layer. A constant amplitude, high frequency alternating energizing current is passed through the heater and, as a result of the skin effect phenomenon, is initially concentrated in one skin depth corresponding to the thickness of the magnetic material. When the temperature at any point along the heater reaches the Curie temperature of the magnetic material, the magnetic permeability of the magnetic material at that point decreases dramatically, thereby significantly increasing the skin depth so that the current density profile expands into the non-magnetic substrate of low resistivity. The overall result is a lower resistance and lesser heat dissipation. If thermal sinks or loads are placed in contact with the heater at different locations along the heater length, thermal energy is transferred to the loads at those locations with the result that the temperature does not rise to the alloy Curie temperature as quickly at those locations as it does in the non-loaded locations. The constant amplitude current remains concentrated in the higher resistance alloy layer at the loaded locations which dissipate considerably more resistive heating energy than is dissipated in the non-load locations where the current is distributed in the low resistance substrate.

SUMMARY OF THE INVENTION

In accordance with the present invention a heater is preferably, but not necessarily, a self-regulating heater and has at least one but in most cases a plurality of thermally and electrically-conductive connecting members projecting therefrom. The connecting members, which may be finger-like projections, are in thermally-conductive contact with the heater body and are mutually spaced to correspond to the spacing between the solder connection sites. Each projecting connecting member is inserted between a pair of contacts to be soldered at a respective connection site so that thermal energy for melting solder may be delivered directly to the site by the connecting member. A prescribed amount of solder, as required for the particular connection, is pre-deposited on the connecting member and/or the contacts to be joined and is melted by the thermal energy applied directly to the connection site from the heater via the connecting member. After the soldering step, the electrically-conductive connecting members may be severed from the heater and remain permanent components of the respective solder joints; in certain embodiments the heater body and connecting member remain integral and both are permanent components of the solder joint. Current through the heater body may be conducted directly from a constant amplitude alternating current source or may be induced as eddy currents in the heater body from primary windings connected to the source.

BRIEF DESCRIPTION OF THE DRAWINGS

Specific embodiments of the present invention are illustrated in the accompanying drawings wherein like reference numerals in the various Figures are utilized to designate like components, and wherein:

FIG. 2b is a view in longitudinal section taken along lines 2b—2b of FIG. 2a with electrical connections to the heater assembly schematically illustrated;

FIG. 3 is a view in transverse section similar to FIG. 2a but showing the heater assembly broken away from the connecting members after soldering;

FIG. 14 is a view in perspective of a heater assembly having flexible connecting members projecting therefrom in accordance with an alternative embodiment of the present invention;

FIG. 15 is a view in perspective of an alternative heater assembly having severable projecting connecting members constructed in accordance with the present invention;

DESCRIPTION OF THE PREFERRED EMBODIMENTS

Figure 1:
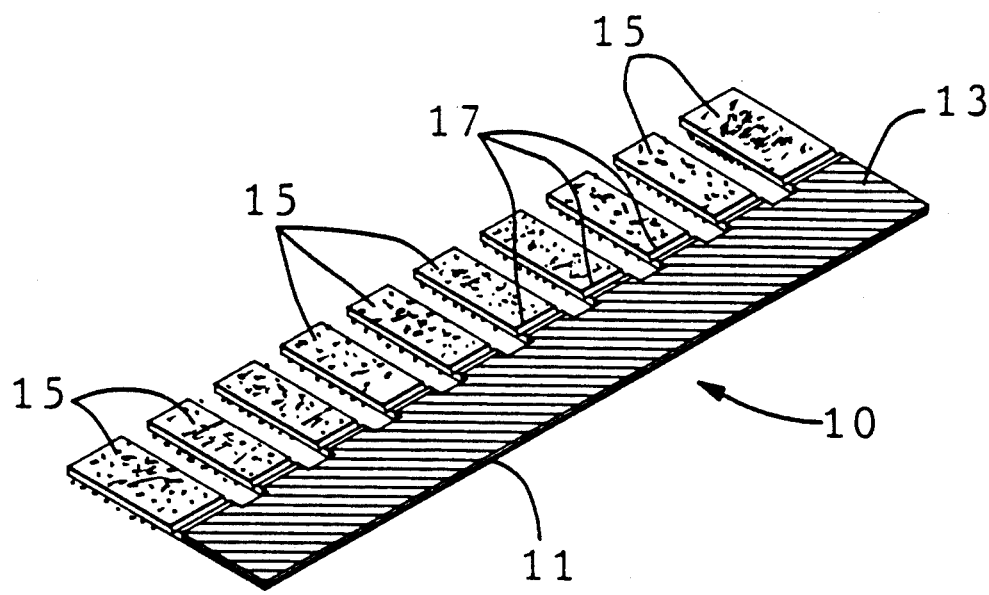
FIG. 1 is a view in perspective of a heater assembly with severable connecting members projecting therefrom in accordance with the present invention.

Referring specifically to Figure of the accompanying drawings, there is illustrated an apparatus 10 for use in soldering one set of contacts to another set of contacts. The apparatus includes an elongated rectangular substrate 11 of copper, copper alloy, phosphor bronze, beryllium copper, brass or other material having a high electrical conductivity (i.e., low resistivity) and negligible magnetic permeability (i.e., a permeability of, or close to, one).

The substrate material must also be a good thermal conductor. Substrate 11 typically, although not necessarily, has a length much greater than its width which, in turn, is much greater than its thickness. As an example of these relative dimensions, the substrate length may be three inches, its width may range from one-tenth to one-half inch, and its thickness may be 0.002 inch. It should be noted that the rectangular substrate configuration illustrated in Figure is merely an exemplary configuration and that substantially any configuration, consistent with the principles described herein, may be employed.

A thermally-conductive layer 13 of magnetic material is deposited or otherwise disposed over one surface of substrate 11. Typically a roll cladding process is used where the magnetic material layer is laid over the substrate then subjected to high pressure and temperature which diffuses the two materials together at the boundary layer, but other processes such as plating or sputter depositing could be used. In the illustrated embodiment layer 13 having a typical thickness of 0.002 inch is disposed over the entirety of that surface but, as described below, may be disposed only on selected surface portions. A typical material for layer 13 is nickel, iron or a nickel-iron alloy, such as Alloy 42 (42% nickel, 58% iron), or Alloy 42-6 (42% nickel, 6% chromium, 52% iron); however, layer 13 may be any metal or alloy having the characteristics described herein. Depending upon the particular material, magnetic permeabilities for layer 13 range from fifty to more than one thousand, as compared to a permeability of one for copper; typical electrical resistivities for layer 13 range from twenty to ninety micro-ohms per centimeter as compared to 1.72 for copper. The thickness of layer 13 is typically one skin depth. In this regard, substrate 11 and layer 13, when energized by passing a constant amplitude alternating current therethrough, function as a self-regulating heater. Specifically, for temperatures below the Curie temperature of the material of layer 13, slightly more than sixty-three percent of the constant amplitude current flowing through the heater is concentrated in one skin depth from the heater surface. The skin depth is proportional to the square root of the material resistivity, and is inversely proportional to the square root of the product of the magnetic permeability of layer 13 material and the frequency of the alternating current passing through the heater. At temperatures equal to or above the Curie temperature of the layer 13 material, the magnetic permeability of the material drops to approximately that of the substrate material (i.e., a permeability of one, for copper), thereby producing a dramatic increase in the skin depth. Consequently, much more of the constant amplitude current is distributed in the lower resistivity substrate 11 than in higher resistivity layer 13, with the result that considerably less heat is dissipated. Importantly, if selected locations of the heater body are in contact with thermal energy absorptive loads (e.g., heat sinks), then the temperature at those locations of the heater body does not rise as readily as it does at the non-load locations. It is possible, therefore, for the constant amplitude current to be concentrated in layer 13 to a greater extent at the load locations (where the temperature is below the Curie temperature for layer 13) than at the non-load locations (where the temperature is equal to the Curie temperature of material 13). Curie temperatures for materials can range from 50 degrees C to 1000 degrees C; typical materials employed for layer 13 have Curie temperatures in the range of 200 degrees C to 500 degrees C, depending on the solder or fusing material employed.

A plurality of thermally and electrically conductive connecting members 15 project from the heater body. In the embodiment illustrated in FIG. 1, there are ten connecting members 15 projecting from a common edge of the heater body in spaced parallel relation. The spacing between the connecting members 15 is determined by the spacing between contact pairs to be joined by soldering, as described below. Likewise, the configurations of the connecting members 15 are determined by the configurations of the contacts to be joined. In the illustrated embodiment the spacing is the same between each pair of adjacent connecting members, and the configurations of the connecting members are identical. In particular, connecting members 15 are finger-like projections of sufficient rigidity to retain their shape when suspended in cantilever fashion from the heater body. Importantly, each connecting member 15 is in thermally-conductive relation with the heater body so that each member 15 may conduct thermal energy developed in the heater body to a respective connection site where a soldering operation is to be performed. The connecting members may be formed by stamping, or the like, as integral parts of the substrate 11, in which case the thickness of each connecting member 15 may be on the same order of magnitude as the thickness of the substrate. Of course, the thickness of the connecting members may be greater or less than the thickness of the substrate.

An important aspect of this embodiment of the invention resides in the fact that connecting members 15 may be readily severable from the heater body after a solder operation has been completed. Accordingly, each connecting member 15 is provided with a notch 17 extending transversely across the member and to a sufficient depth to permit the heater body to be broken away from the members 15 by bending, tearing, etc. Alternatively, the connecting members 15 may be scored, perforated or otherwise weakened in torsional strength to facilitate their separation from the heater body.

Figure 2A:
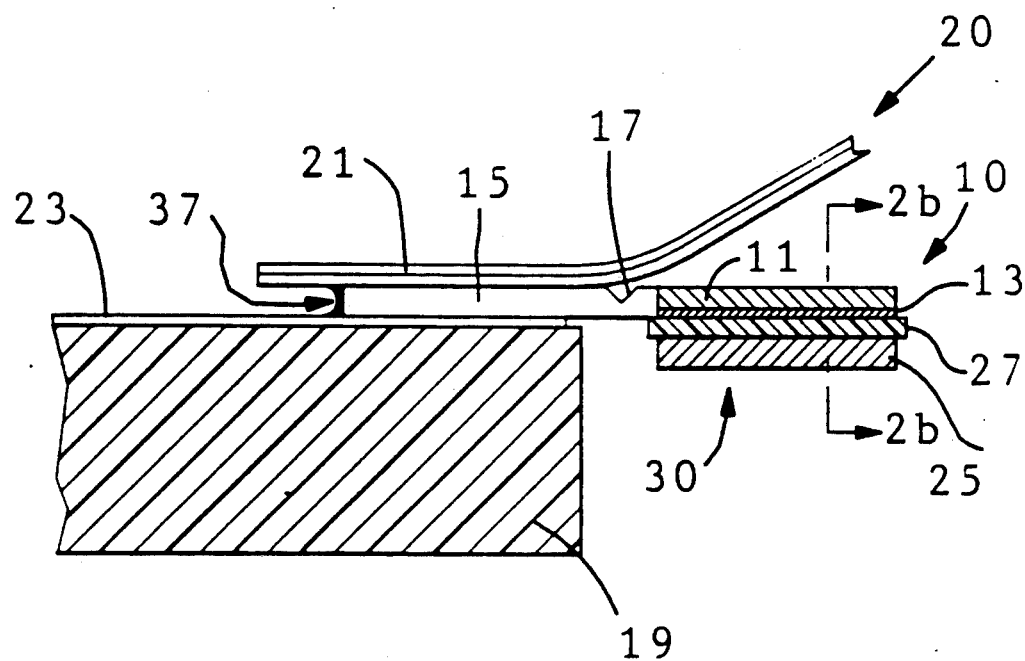
FIG. 2a is a view in transverse section of the assembly of FIG. 1 showing that assembly employed for soldering a flexible etched cable to contact pads on a printed circuit board.

Referring to FIGS. 2a and 2b of the accompanying drawings, heater assembly 10 is illustrated as being utilized to solder conductors 21 in a flexible etched cable 20 to respective contact pads 23 on a printed circuit board 19. Although only a single cable conductor 21 and a single contact pad 23 are visible in FIG. 2a, it is to be understood that plural spaced conductors 21 and spaced pads 23 are provided, and that all of the conductors 21 are to be soldered to respective contact pads 23 simultaneously. Initially, at each connection site, a finger-like connecting member 15 is placed on a respective contact pad 23. It is assumed that the spacing between connecting members 15 is the same as the spacing between contact pads 23, and that the configuration of the connecting members is such that each member 15 contacts its respective contact pad 23 without contacting any other pad or circuit component on board 19. Each conductor 21 in cable 20 is then placed on a respective connecting member 15. Thus, at each connection site there is flush physical contact between the three stacked electrically-conductive elements, namely, contact pad 23, connecting member 15 and cable conductor 21, albeit for solder as described below.

In order to actuate the heater, a tooling assembly 30 is employed and comprises a conductive bus bar layer 25 and a superposed layer 27 of electrically insulative material. The bus bar layer 25 is typically copper and has dimensions similar to those of substrate 11. Insulative layer 27 is typically Kapton and is slightly larger in length and width than the corresponding substrate dimensions; the thickness of layer 27 is of the same order of magnitude as that of the substrate. The tooling assembly 30 is secured flush against heater body assembly 10 with the exposed surface of insulative layer 27 abutting the skin layer 13 of the heater body. The heater body and tooling may be held together permanently by adhesive between layers or any other technique that joins the tooling to the heater body in flush abutting relation.

As best illustrated in FIG. 2b, a source 31 of constant amplitude alternating current is connected in series with an impedance matching circuit 33, and this combination is connected across the heater body assembly (at substrate 11) and the tooling assembly 30 (at bus bar layer 25) at one end of the heater assembly. Source 3 may be any suitable constant amplitude alternating current supply such as, for example, the source disclosed in U.S. Pat. No. 4,626,767 (Clappier et al) and provides a constant amplitude alternating signal, typically in the radio frequency range. Most commonly, the frequency of the actuating signal is 13.56 MHz. The constant amplitude of the signal is selected to provide the desired heating level. Impedance matching circuit 33 serves to match the impedance of the heater-tooling combination to the source impedance.

At the end of the heater body located longitudinally remote from the connection to source 31, there is a wire 35 or other short circuit interconnecting substrate 11 and bus bar 25. Current flow through the heater, therefore, at any instant of time, is in longitudinally opposite directions in the heater 10 (i.e., substrate 11 and layer 13), and bus bar 25. A resulting electric field is established between heater 10 and bus bar 25 across insulation layer 27, thereby concentrating the current flowing through the heater assembly in the high resistance surface layer 13 rather than in low resistance outer surface of the substrate. The current flowing through bus bar layer 25 is concentrated at the surface facing the heater assembly 10. Since the current amplitude is maintained constant, it is desirable, for optimal heating, to concentrate the current in the higher resistance layer 13 of heater assembly 10 than in the low resistance substrate 11. That is, the resistive heating, with the current, I, maintained constant, is greater when the current path has greater resistance, R. The electric field, developed by the oppositely-directed current flowing in heater assembly 10 and bus bar 25, assures that the current in the heater assembly is concentrated in the high resistance surface region of the heater assembly facing the bus bar.

As illustrated in FIG. 2a, the thermal energy resulting from resistive heating is conducted to the various finger-like connecting members 15 in order to melt solder that is deposited in pre-determined amounts on one or more of the connecting members 15, contact pads 23 and conductors 21. A typical solder is 63 percent tin with the balance being lead, having a melting point of 183 degrees C. In the preferred embodiment of the present invention the distal end of each connecting member 15 has solder deposited on both surfaces so that, upon actuation of heater assembly 10, a solder fillet 37 is created between conductor 21 and contact pad 23; solder fillets also tend to form between conductors 21 and connecting members 15, between connecting members 15 and contact pads 23, and between conductors 21 and contact pads 23. In addition, small amounts of solder join abutting surfaces of conductors 21 and connecting members 15, and join the abutting surfaces of contact pads 23 and connecting members 15. The result is a mechanically strong and electrically conductive solder connection at each connection site. The amount of solder deposited is sufficient to effect the desired solder joint but insufficient to result in solder bridging between connection sites.

The nature of heater assembly 10 is such that the resistive heating is produced only where it is needed to effect the soldering operations. More specifically, the current through heater assembly 10 flows longitudinally and thereby alternately encounters regions from which connecting members 15 project and regions corresponding to spaces between the connecting members 15. Thermal energy developed in regions proximate the connecting members is conducted to respective connection sites by members 15, thereby preventing the temperature at those regions from building up quickly. On the other hand, in the regions corresponding to the spaces between members 15, the temperature increases rapidly until it reaches the Curie temperature of the material of layer 13, whereupon the effective skin depth is increased dramatically in those regions. This causes more current to flow through the low resistance substrate material in these regions and, as a consequence, less thermal energy is produced therein. The regions proximate connecting members 15 continue to develop high amounts of thermal energy that is conducted to the respective connection sites. Overheating of the connection sites is prevented by the same mechanism; that is, once the temperature at the connection site reaches a certain level, thermal conduction from the heater to the site ceases, thereby removing the heat sink effect of the connection site. The thermal energy developed by the current flowing in high resistance layer 13 then quickly increases the temperature proximate the connecting members 15 until the Curie temperature of the material is reached. At this point the effective skin depth along the entire length of the heater assembly is increased so that more of the constant amplitude current flows through the low resistance substrate 11 and significantly less thermal energy is produced by resistive heating. After current is removed from the heater assembly, the assembly begins to cool and the solder is permitted to harden. The cooling proceeds quickly because the relatively low mass of the heater does not retain its heat for long periods of time.

The heater assembly 10 and tooling 30 are broken away from the severable connecting members 15 after the solder hardens. This break-away operation is effected by bending the heater and tooling relative to members 15 along the linearly aligned notches or grooves 17 in the manner illustrated in FIG. 3. The connecting members 15 remain a permanent part of the solder joint at each connection site and provide a low-resistance current path between conductors 21 and contact pads 23.

Figure 4:
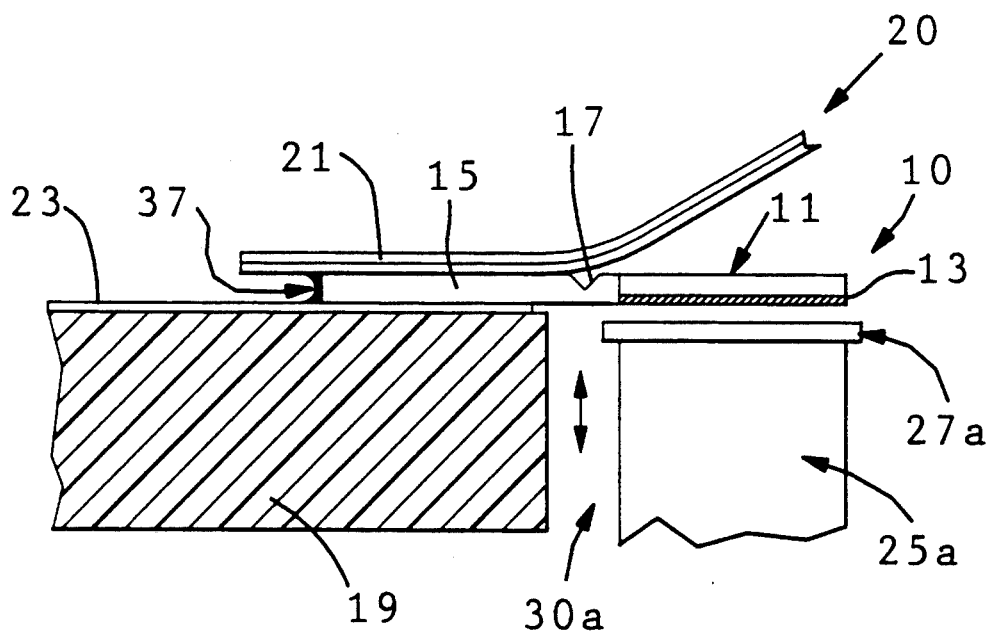
FIG. 4 is a view in transverse section similar to FIG. 2a showing the heater assembly of FIG. 1 employed in conjunction with a removable tooling bar.

In the embodiment illustrated in FIG. 4 a removable tooling assembly 30a replaces the permanently secured tooling assembly 30 illustrated in FIGS. 2a, 2b and 3. An electrically conductive ground bar 25a has insulative or dielectric layer 27a secured at one end thereof and adapted to be placed flushed against skin layer 13 of self-regulating heater assembly 10 when a soldering operation is to be performed. Ground bar 25a is typically connected to electrical ground or common and is re-usable with different heater assemblies to perform multiple sequential soldering operations. A source 31 constant amplitude alternating current and a short circuit connection 35 (see FIG. 2b) are connected across substrate 11 and ground bar 25a in the manner described above to perform a soldering operation.

Figure 5:
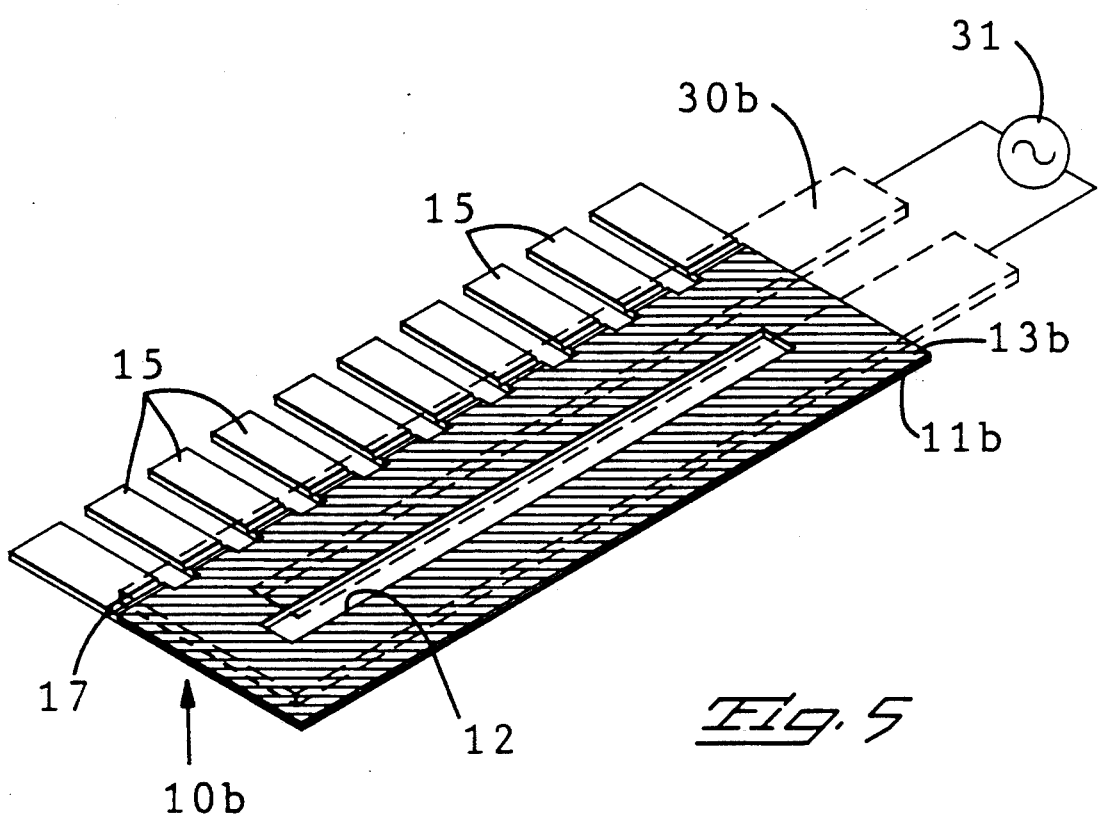
FIG. 5 is a view in perspective of an alternative heater assembly with severable connecting members projecting therefrom in accordance with the present invention.

Another self-regulating heater 10b is illustrated in FIG. 5. A substrate 11b and skin layer 13b deposited or otherwise overlying the substrate are similar to substrate 11 and skin layer 13, respectively, described above but may have a cut-away interior portion 12 resulting in a flat closed loop configuration about portion 12. Energization of heater assembly 10b is effected by inductive coupling through a generally U-shaped primary circuit 30b having a source 31 of constant amplitude alternating current connected across its ends. The primary circuit 30b is typically part of the tooling employed to perform a soldering operation and is removable from the heater assembly. Primary circuit 30b, when positioned for use, overlies heater assembly 10b and is spaced from skin layer 13b by means of an insulative layer (not shown) disposed on its bottom surface and/or by an air gap. Current flow through the primary circuit induces eddy currents in the heater assembly of sufficient magnitude to result in resistive heating required to effect soldering operations at each of the connecting members 15. It will be appreciated that the single turn primary circuit 30b may be replaced by plural turns, such as by winding plural turns of insulated wire about the heater body either longitudinally or transversely (i.e., between connecting members 15 or through cut-away portion 12). In either case, inductive coupling from the primary circuit induces eddy currents in the heater body to raise the temperature of the connecting members 15 to the desired soldering temperature.

Figure 6:
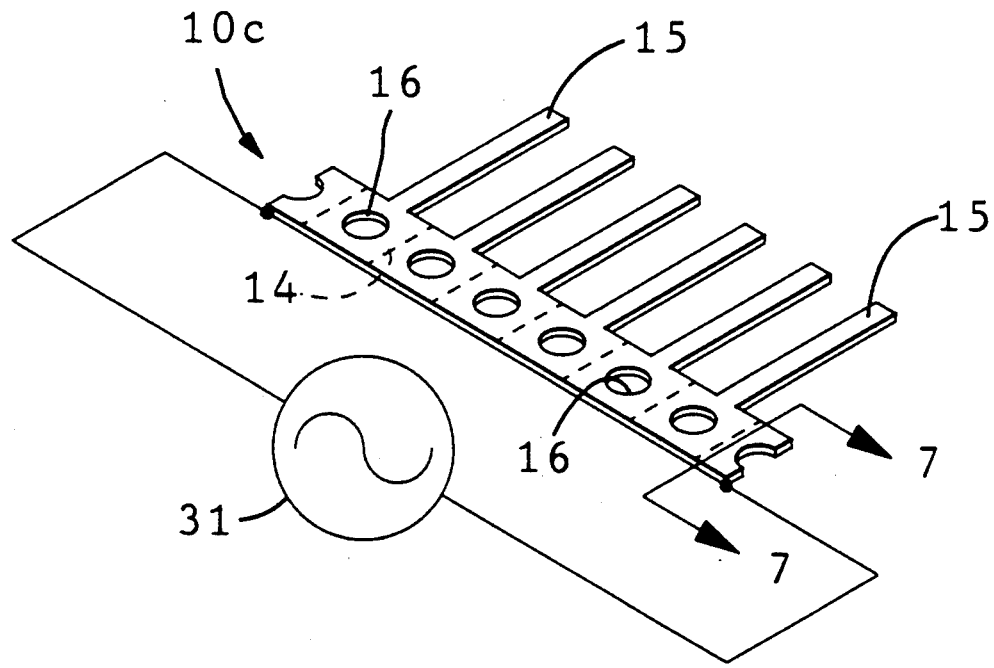
FIG. 6 is a view in perspective of another embodiment of the present invention including a heater assembly with severable connecting members.
Figure 7:
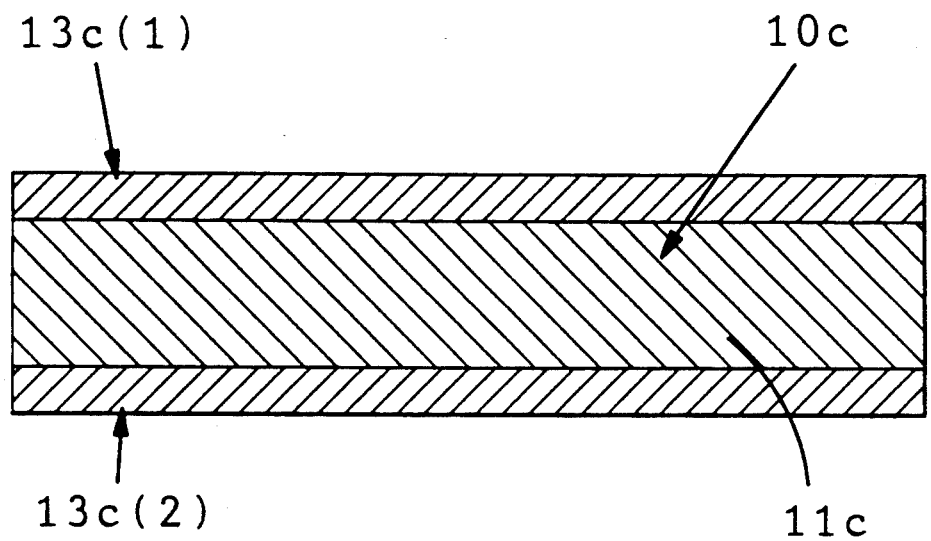
FIG. 7 is a view in transverse section taken along lines 7—7 of FIG. 6.

Referring to FIGS. 6 and 7, self-regulating heater 10c includes a substrate 11c of generally rectangular transverse cross-section having two magnetic skin layers 13c(1) and 13c(2) deposited or otherwise disposed on respective opposite surfaces corresponding to the larger legs of the cross-section. The resulting three-layer heater assembly 10c is energized for a soldering operation by connecting a source 31 of constant amplitude alternating current across its length at any of the three layers.

The body of heater assembly 10c and its projecting connecting members 15 are shown in the form of a carrier strip with a series of longitudinally-spaced pilot holes 16 defined therethrough to simplify handling of the carrier strip during fabrication and to facilitate alignment of the strip with various connection sites for a soldering operation. If desired, a series of longitudinally-spaced perforations 14 may extend widthwise across the heater assembly body to permit each sequential section of that body to be separated from the others along with a corresponding connecting member 15 after a soldering operation. In this manner the individual separated sections of the heater body may remain permanent parts of respective solder joints. In order to assure against contact between the separated heater body sections, two perforated lines may be provided between each pair of separable body sections so that a short length of body section may be discarded between each section pair.

The use of the two magnetic skin layers 13(c)1 and 13(c)2, rather than just one skin layer, renders the self-regulating feature of the heater more effective. In particular, unless the current flow is otherwise constrained, the skin effect tends to concentrate the current at all of the surfaces of the substrate, not merely the surface where the magnetic skin layer is disposed. Thus, if the magnetic material is disposed only on one surface of the substrate, the current flowing in the skin depth of lower resistance material at the other surfaces does not significantly contribute to the desired resistance heating and is, therefore, substantially wasted. Moreover, that current does not experience a current distribution change (i.e., an increase in skin depth) at and above the Curie temperature of the magnetic material and, therefore, does not contribute to temperature self-regulation. Likewise, if the substrate were to have a square transverse cross-section and two surfaces were to have a magnetic skin layer, the desired operation would not be efficiently attained. Ideally, therefore, all of the surfaces of the substrate should be coated with the magnetic skin layer to take maximum advantage of the thermal self-regulation effects. As a practical matter, a substrate having a rectangular cross-section, and a width very much greater than its depth, serves effectively as a self-regulating heater when only the two larger surfaces are clad with the magnetic skin layer. For example, substrate 11c would typically have a width that is at least fifty times greater than its depth or thickness. Of course, in each application where the current is substantially constrained to flow along one surface, as where an electric field is established between substrate 11 and bus bar 25 (FIG. 1), efficient self-regulation is obtained even if only that surface is clad with the magnetic skin layer.

Figure 8:
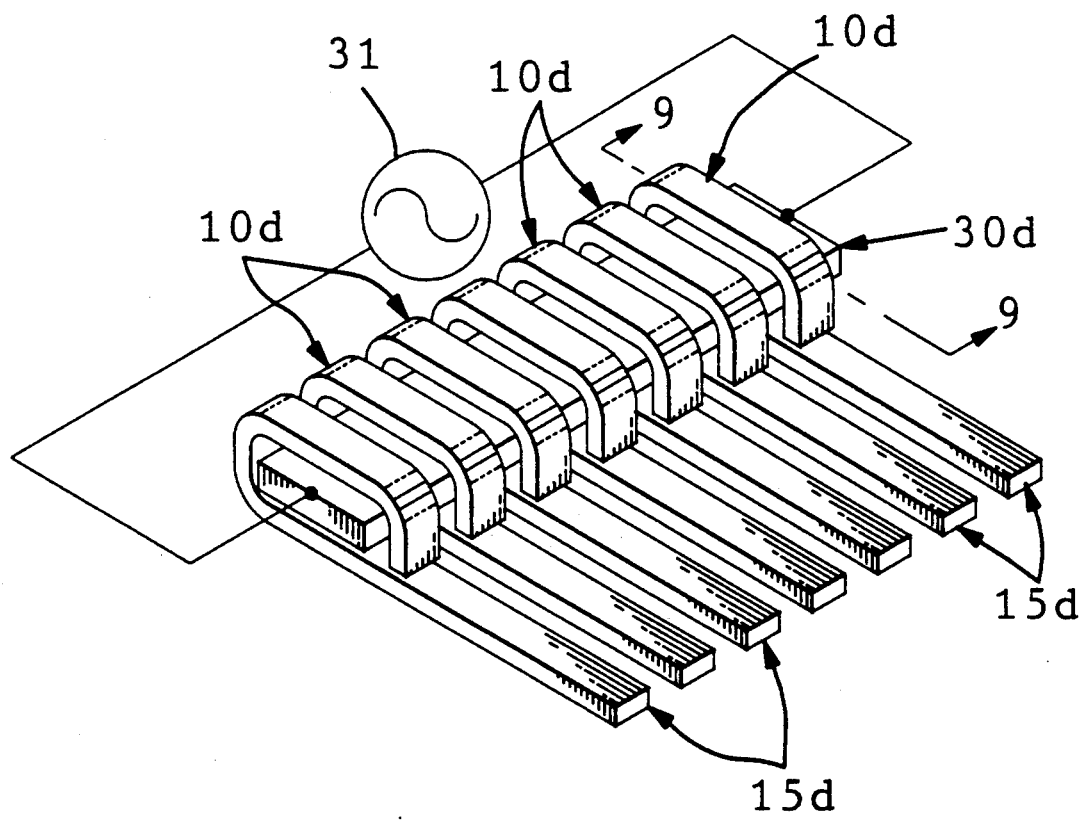
FIG. 8 is a view in perspective of another embodiment of a heater assembly and projecting connecting members constructed in accordance with the principles of the present invention.
Figure 9:
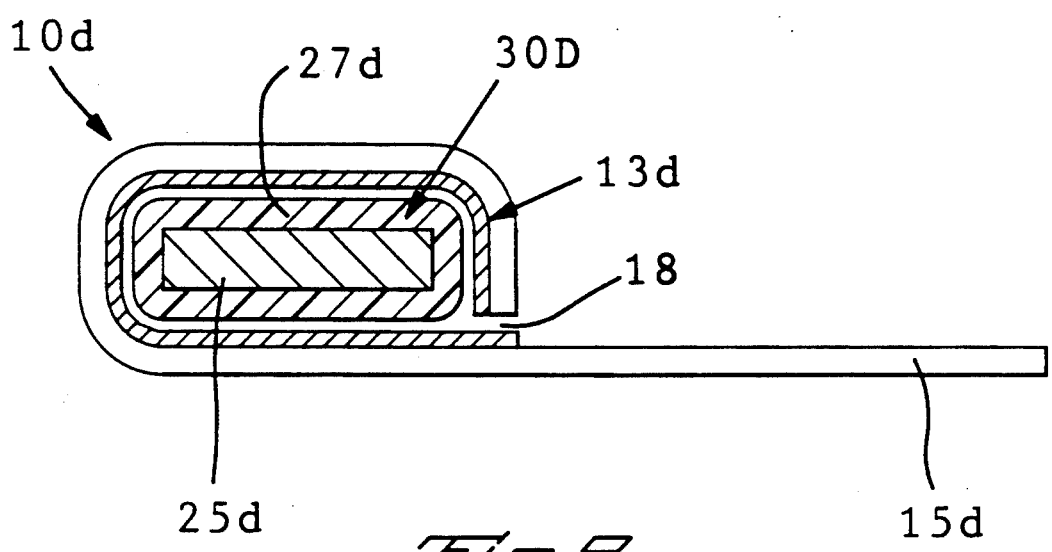
FIG. 9 is a view in transverse section taken along lines 9—9 of FIG. 8.

Another embodiment in which heater body sections remain permanent parts of the solder joints is illustrated in FIGS. 8 and 9 to which specific reference is now made. The electrically and thermally conductive connecting members 15d, instead of projecting from a common heater body, are individual and separate components. Each connecting member is bent back toward itself at its proximal end to form a loop 10d serving as the heater body. The connecting member loop 10d may be open, as illustrated, with the proximal tip of the connecting member spaced a small distance 18 from the intermediate portion of the member; alternatively, the loop may be closed (i.e., the proximal end may be bent to abut the intermediate portion). A skin layer 13d is deposited or otherwise disposed on the portion of each connecting member facing interiorly of the loop. An inductive heating tool 30d includes an elongated conductor 25d surrounded by an insulative layer 27d. In order to effect a soldering operation the heating tool 30d is inserted through the proximal end loops 10d of each of the connecting members 15d that are to be employed during the soldering operation. The connecting members 15d are spaced from one another along the length of the inductive heating tool 30d as required by the spacing between the various solder connection sites. A source of constant amplitude alternating current is connected across the length of conductor 25d, and the resulting primary current through that conductor induces eddy currents on the inwardly-facing surface of the loop 10d of each of the connecting members 15d. The resulting induced eddy currents in each connecting member are subject to the same skin effect phenomenon described above, whereby the magnetic skin layer 13d dissipates sufficient resistive heating to perform a soldering operation at the distal end of the connecting member. The distal end of each connecting member 15d may be severed from the loop portion to remain part of the solder connection. Alternatively the entire member 15d, including the loop, may remain with the connection.

Figure 10:
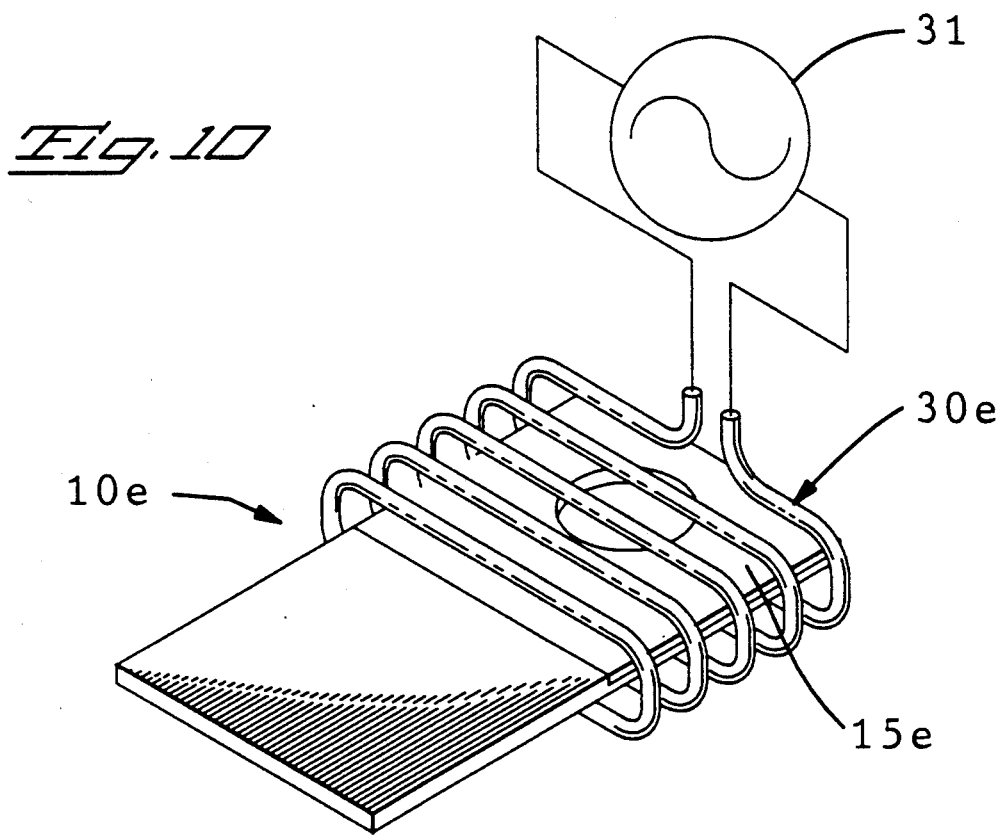
FIG. 10 is a partially schematic view in perspective of an alternative embodiment of the present invention.

In the embodiment illustrated in FIG. 10, the heater body 10e takes the form of a connecting member 15e-configured as an individual copper tab having one or both surfaces clad with a suitable magnetic skin layer. The proximal end of the tab is surrounded with multiple turns of electrically insulated wire forming a primary winding 30e. To effect a soldering operation, alternating current from a constant amplitude source 31 is passed through the primary winding 30e and induces eddy currents in the connecting member 15e which functions in response thereto as a self-regulating heater. Each tab-like connecting member 15e is thus individually energized by its own primary winding 30e and is removable from that winding after a soldering operation to remain a permanent part of the solder connection. Alternatively, the primary winding 30e may remain a permanent part of the connecting member 15e and of the resulting solder connection; under such circumstances, however, it is obviously necessary to remove the winding from source 31 after the soldering operation is completed.

Figure 11:
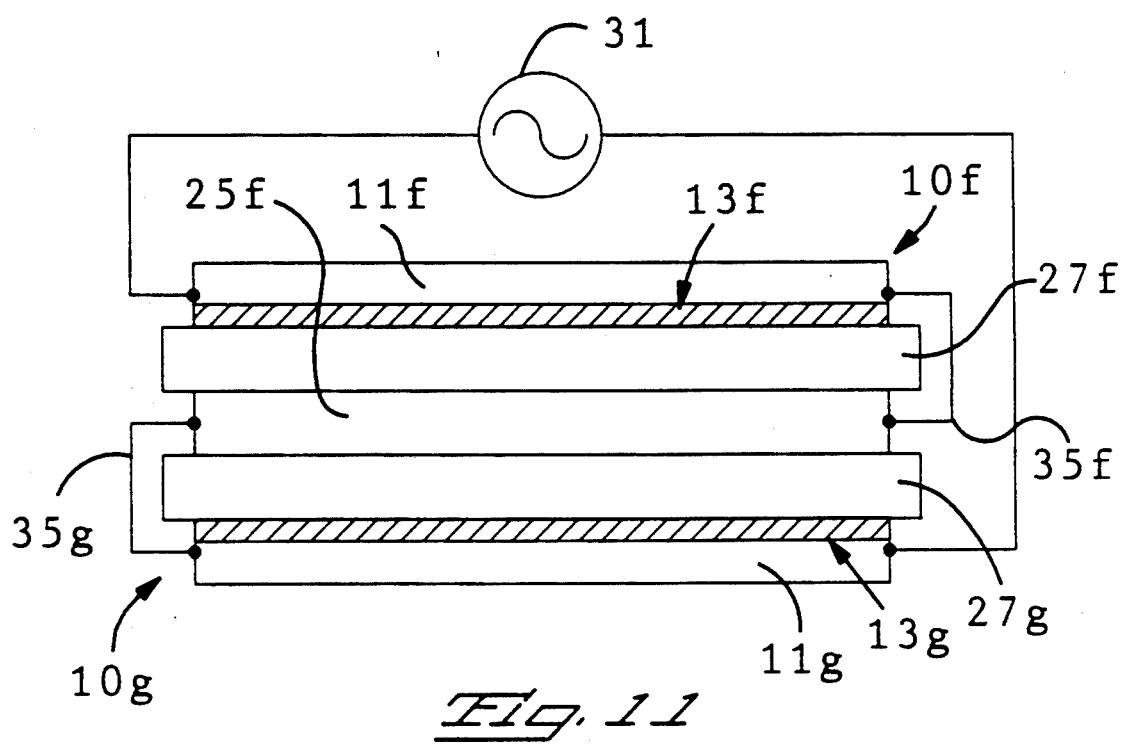
FIG. 11 is a view in longitudinal section of another embodiment of the present invention.

Referring to FIG. 11, first and second self-regulating heater assemblies 10f and 10g are disposed on opposite sides of a bus bar 25f. Heater assembly 10f is similar to heater assembly 10 (FIG. 1) and includes a substrate 11f and magnetic skin layer 13f. One or more connecting members (not shown, but similar to members 15 of FIG. 1) extend from the substrate and/or skin layer. Heater assembly 10g is likewise similar to heater assembly 10 and includes a substrate 11g, magnetic skin layer 13g and one or more connecting members. Skin layer 13f is disposed flush against one surface of insulative layer 27f, the other surface of which abuts one surface of bus bar 25f. Skin layer 13g is disposed flush against one surface of insulative layer 27g, the other surface of which abuts a second surface of bus bar 25f. To effect a soldering operation, a source 31 of constant amplitude alternating current is connected between opposite longitudinal ends of heater assemblies 10f and 10g. A wire or other short circuit connection 35f is connected between the second end of heater assembly 10f and one end of bus bar 25f; a second short circuit connection 35g is connected between the second end of heater assembly 10g and the second end of bus bar 25f. As a consequence of these connections the current passing through bus bar 25f at any instant of time is in a direction longitudinally opposite the direction of current flowing through each of heater assemblies 10f and 10g. The resulting electric fields are thereby established between bus bar 25f and each of respective heater assemblies 10f and 10g, thusly assuring that current flowing through the heater assemblies is concentrated in the proximate high resistance skin layers 13f, 13g rather than flowing through the remote low resistance substrates 11f, 11g. As a consequence, considerably greater resistive heating is produced for the soldering operation.

Figure 12:
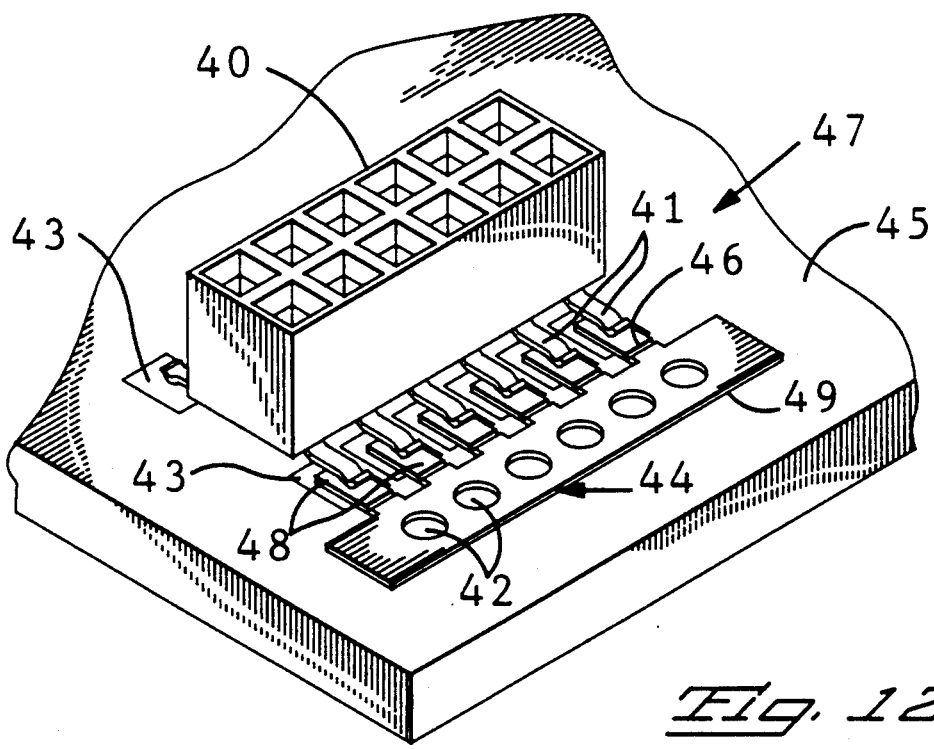
FIG. 12 is a view in perspective of an alternative embodiment of a heater assembly of the present invention shown in position for soldering the solder tails of a surface mount connector to contact traces on a printed circuit board.

Referring to FIG. 12, the solder tails 41 of a surface mount connector 40 may also be joined to contact pads or traces 43 on a printed circuit board 45 by utilizing the techniques described above. The heater assembly 47 may be any of the self-regulating heaters described above or may be a self-regulating heater that is incorporated in a generally rectangular carrier strip in the manner described and il in co-pending U.S. patent application Ser. No. 277,361) entitled "Self Regulating Temperature Heater Carrier Strip" by McKee et al filed contemporaneously herewith and assigned to the same assignee as the present invention. The disclosure in that patent application is expressly incorporated herein, in its entirety, by this reference. For present purposes it is sufficient to understand that the heater assembly includes two heater units, each having a substrate of copper, or the like, and a skin layer of magnetic material. The two heater units are disposed with their skin layers flush against a common insulative layer. When employed to effect a soldering procedure, the heater assembly 47 has a constant amplitude alternating current source connected between the two heating units at one longitudinal end of the assembly; the other longitudinal end of the assembly is provided with a short circuit between the two heating units so that current flow at any instant of time is in opposite longitudinal directions in the two heating units. It will be appreciated that each heating unit serves as a return path for the other, and that an electric field is established between the two heating units across the insulative layer. The advantages of this type of double heating unit assembly are described subsequently in relation to FIGS. 15 and 16.

Multiple finger-like connecting members 48 project transversely from a longitudinally-extending edge of one or both heating units. Each connecting member 48 has a transverse score line or notch 46 defined therein to facilitate severing of the connecting fingers from the heater assembly 47. Longitudinally spaced pilot holes 42 may be defined in the assembly 47 to facilitate handling of the carrier strip during fabrication and to facilitate alignment of the heater assembly with the various connection sites.

When the constant amplitude alternating current is passed through the heater assembly, solder tails 41 are joined to respective plated contact pads 43 by means of the connecting members 48 which conduct the thermal energy from the heater assembly to respective connection sites to melt solder as described above. The electrically conductive connecting members 48 remain permanent parts of each connection site and are readily severable from heater assembly 47 at notches 46 after the soldering operation.

Figure 13:
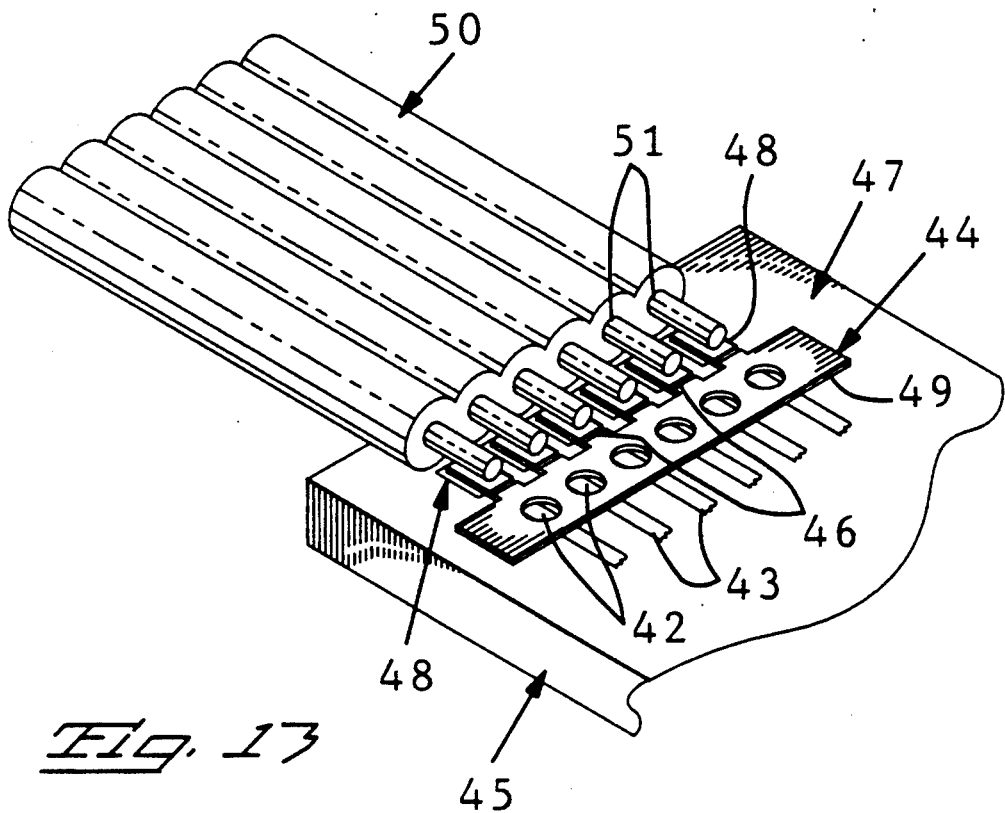
FIG. 13 is a view in perspective of the heater assembly of FIG. 12 shown in position for soldering a ribbon cable to contact traces on a printed circuit board.

Referring to FIG. 13, heater assembly 47 is shown positioned to solder multiple conductors 51 of a ribbon cable 50 to respective contact pads or traces 43 on printed circuit board 45. It is to be understood that the conductors may also be discrete wires rather than parts of a unitary cable. The operation of the heater assembly, is the same as described above in relation to FIG. 12.

The heater assembly 55 illustrated in FIG. 14 is a modified version of heater assembly 10 wherein the connecting members 57 are flexible rather than rigid. More particularly, each connecting member 57 is sufficiently thin or otherwise weakened to permit it to collapse or bend under its own weight, but is nevertheless both thermally and electrically conductive. The connecting members may be formed as part of the substrate or may be secured thereto by means of a heat-resistant bond. The main advantage of the collapsible connecting members 57 resides in the fact that the members may be easily severed from the heater by means of scissors or other cutting blade members after the soldering process. The collapsible connecting members may be employed with any of the heating assemblies described herein.

Figure 16:
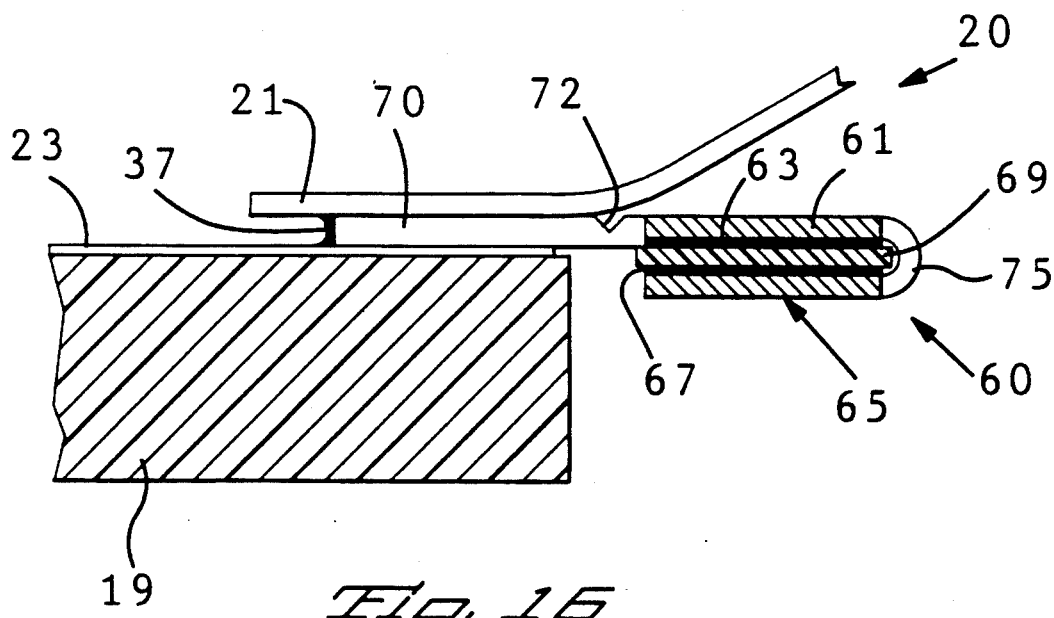
FIG. 16 is a view in transverse section of the assembly of FIG. 15 showing that assembly employed for soldering a flexible etched cable to the contact pads on a printed circuit board.

The heater assembly 60 illustrated in FIGS. 15 and 16 effectively utilizes two heater units to increase the initial heating capacity of the assembly. A first heater unit includes a substrate 61 of copper or like metal on which a magnetic alloy or metal skin layer 63 is disposed. A second heater unit includes a similar substrate 65 on which magnetic alloy or metal skin layer 67 is disposed. The heater units are disposed with their magnetic layers secured flush against respective opposite sides of an insulative layer 69. Plural connecting members 70 project from an edge of one heater unit (e.g., substrate 61) and include transverse notches 72, or the like, to facilitate severability from the heater assembly. The dimensions and characteristics of the components of each heater unit and the insulative layer are chosen in accordance with the requirements described above in relation to FIGS. 1, 2a and 2b. The two heater units comprising assembly 60, however, are preferably formed as side-by-side units on the same surface of a common copper substrate that is folded through approximately 180 degrees about the longitudinal center between the two units to thereby sandwich insulation layer 69 between the skin layers 63 and 67. This type of heater structure is the subject of co-pending U.S. patent application Ser. No. 277,170, now U.S. Pat. No. 4,990,736, filed contemporaneously herewith by McKee et al, entitled "Generating Electromagnetic Fields In A Self Regulating Temperature Heater By Positioning Of A Current Return Bus", and assigned to the same assignee as the present invention. The disclosure in that patent application is by reference expressly incorporated herein in its entirety. For present purposes it is sufficient to understand that the common substrate is provided with a longitudinal slot 71 extending entirely through the substrate thickness along the longitudinal center between the two heater units. Slot 71 is bounded at its longitudinal ends by short end sections 73 and 75 joining the two halves of the common substrate to permit one heater unit to be folded over onto the other in the manner described. One end section 73 has longitudinally-extending score lines or notches 77 defined therein as continuations of the edges of slots 71, thereby permitting end section 73 to be readily severed from the assembly, typically after the units have been folded one onto the other and secured in place by adhesive or the like relative to insulative layer 69.

Once end section 73 has been removed from assembly 60, the only electrical connection remaining between the two heater units is end section 75. A source of constant amplitude alternating current 79 and an impedance matching circuit 81 are connected between substrates 61 and 65 at the end of assembly 60 from which end section 73 has been removed. A current path is thereby established, under the control of an actuable switch 83, or the like, along the lengths of the two heating units through end section 75. The current through the heating units at any instant of time is oppositely directed and thereby establishes an electric field between the two heater units to concentrate current flow in the mutually proximate skin layers 63 and 67.

Soldering the conductors 21 of flexible etched cable 20, for example as shown in FIG. 16, to contact pads 23 on printed circuit board 19 is achieved in the same manner described above in relation to FIG. 2a. There are advantages to using two heater units of assembly 60, however, as compared to the single heater unit and a bus bar 25 employed in the embodiment illustrated in FIG. 2a. One such advantage resides in the fact that there are two high resistance paths (i.e., layers 63 and 67) as opposed to only one such path in the embodiment of FIG. 2a, thereby producing greater initial heating from the same constant current. In other words, thermal energy for soldering is provided by both heater units simultaneously, whereas the use of a return bus bar 25 (FIG. 2a) generates approximately half as much thermal energy for soldering. A second advantage concerns the practical aspects of energizing the heater. Such energization is much simpler for the end user with heater assembly 60 since there is no need to join separate tooling components (e.g., elements 25 and 27 of FIG. 2a) to the heater. Rather, assembly 60 is fabricated by the manufacturer in a manner such that each heater unit serves as the current return path for the other.

Figure 17:
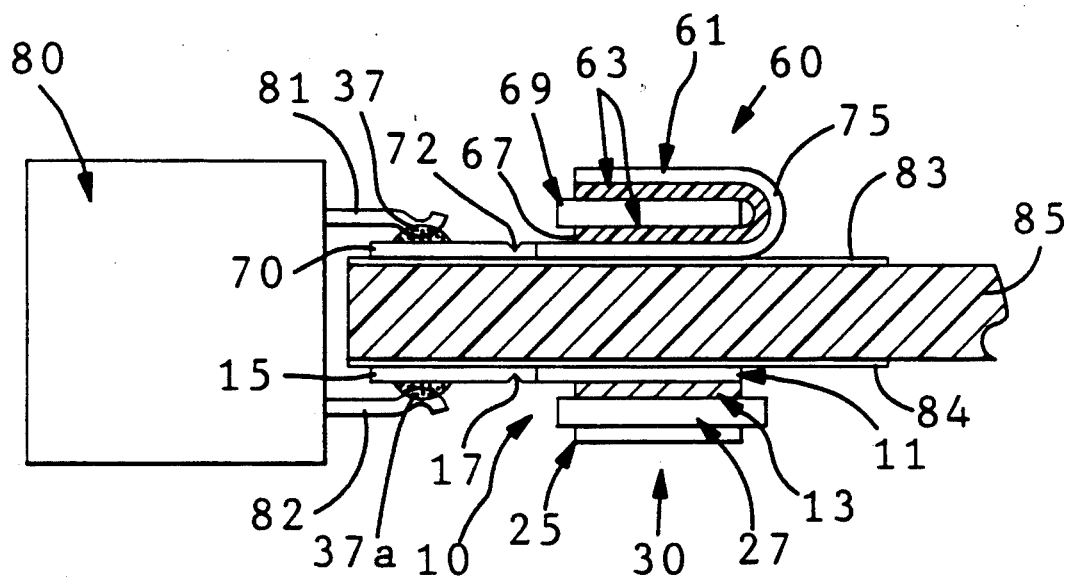
FIG. 17 is a view in transverse section of the assemblies of FIGS. 1 and 15 employed on opposite sides of a printed circuit card to solder respective sets of contacts of a card edge connector to contact pads on the card.

FIG. 17 illustrates how parallel rows of contacts 81 and 82, respectively, of a card edge connector 80 may be soldered to contact traces 83 and contact traces 84, respectively, disposed on opposite surfaces of a printed circuit board 85 utilizing either the folded back heater assembly 60 or the heater assembly 10 and tooling 30. Contacts 81 are shown being soldered to traces 83 at respective connection sites producing solder fillet 37 by heater assembly 60 utilizing connecting members 70 interposed between the contacts and traces. Operation of heater assembly 60 is identical to the operation described therefor in relation to FIGS. 15 and 16. Heater assembly 10 is employed in conjunction with tooling 30 to solder contacts 82 to traces 84 at respective connection sites producing solder fillet 37a. Connecting members 17 are disposed between the various contacts and traces in the manner previously described. Operation of heater assembly 10 is identical to that described above in relation to FIG. 2a.

Figure 18:
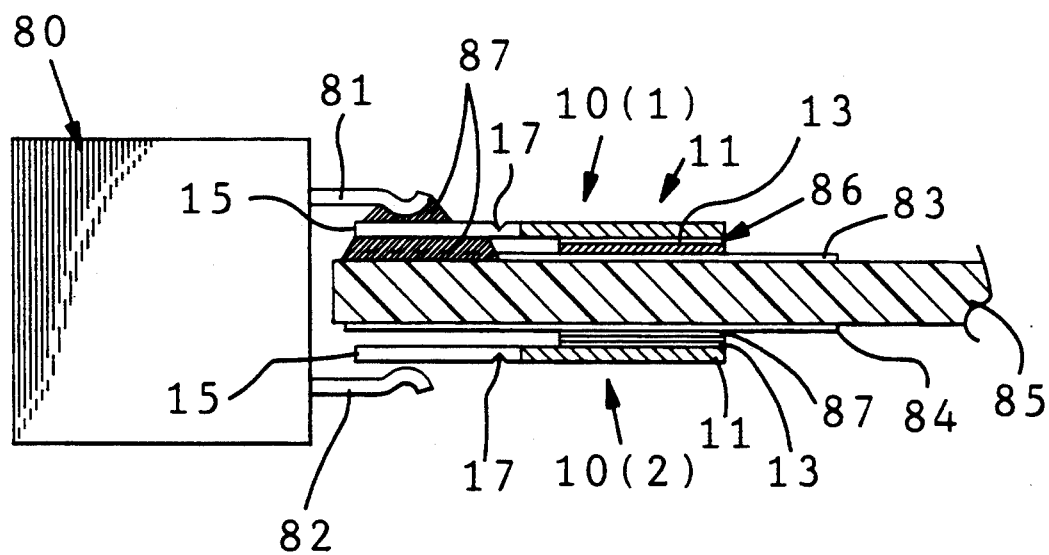
FIG. 18 is a view in transverse section of two self-regulating heater assemblies employed in mutually interactive relation for soldering respective sets of contacts of a card edge connector to contact pads on a printed circuit card.

In FIG. 18 there is illustrated an arrangement whereby card edge connector 80 has its contacts 81 soldered to circuit board traces 83 by means of a first heater assembly 10(1) while contacts 82 are simultaneously soldered to traces 84 by means of a second heater assembly 10(2). The two heater assemblies 10(1) and 10(2) are substantially identical and are the type described above in relation to FIGS. 1 and 2a. A thin dielectric layer 86 is disposed on the surface of skin layer 13 of heater assembly 10(1); a similar dielectric layer 87 is disposed on the surface of skin layer 13 of heater assembly 10(2). These dielectric layers 86, 87, which may also take the form of solder resist coatings on the circuit board surface, insulate the heater surfaces from respective traces 83, 84. By positioning the heater assemblies 10(1) and 10(2) in mutual registration on opposite sides of the printed circuit board 85 as shown, with the heater assemblies insulated from traces 83, 84 by dielectric layers 85, 86, respectively, it is possible to eliminate the tooling required in the embodiment illustrated in FIG. 2a. More specifically, assume that a constant amplitude alternating current source is connected between heater assembly 10(1) and heater assembly 10(2) at one longitudinal and of these assemblies, and that a short circuit is connected between the two assemblies at their opposite longitudinal ends. Further, as shown, the skin layers 13 of heater assemblies 10(1) and 10(2) are disposed flush against respective opposite surfaces of printed circuit board 85. Mutual insulation is provided by the printed circuit board 85, eliminating the requirement for separate tooling insulation layer 27 (FIG. 2a). The heater assemblies 10(1) and 10(2) serve as mutual current return paths, thereby eliminating the need for the separate ground plane return bus 25 (FIG. 2a). The two heater assemblies also provide ground planes for one another with printed circuit board 85 serving as the principal dielectric layer therebetween. The combination of these two heater assemblies, therefore, functions in a manner similar to that of the folded back heater described above in relation to FIGS. 15 and 16. Heater assemblies 10(1) and 10(2) are pressed together to provide predictable geometry. Concentration of the current in the two high resistance skin layers 13 results from the electric field developed across printed circuit board 85 by the oppositely directed currents in the two heater assemblies. A typical solder joint 87 is illustrated for contact 81 and trace 83 and results from the melting or solder initially deposited on connecting members 15 and/or contacts 81 and/or traces 83; a similar solder joint would be made among contact 81, trace 84 and connecting member 15.

As described above, the electrically and thermally conductive connecting members are most efficiently utilized in connection with automatic self-regulating heaters. It is to be understood, however, that these readily severable connecting members may also be used in connection with other types of heaters, including nichrome wire and hot bar heaters. For example, referring to FIG. 19, a heater 90 may take the form of an electrically conductive plate member 91 fabricated from relatively high resistance material. The alloys described above for use in the skin layers in the automatic self-regulating heaters may, for example, be employed as the material for plate member 91. In the illustrated embodiment, the plate member is relatively thin and has a generally U-shaped configuration to conform to a particular orientation of contacts to be soldered; however, it is to be understood that substantially any configuration may serve the purpose of distributing the thermal energy to required locations. Multiple readily severable connecting members project from various edges of plate member 91 as required by the locations of the connection sites to be soldered. For example, connecting member 92 projects radially inwardly from one leg of the U-shaped plate member 91 and has a notch 93 defined transversely therein to permit the distal end of the connecting member to be broken away after a soldering operation. An adjacent connecting member 94 is provided with a right-angle co-planar bend to permit the distal end of that connecting member to reach a particular connection site beyond the distal end of member 92. A suitable notch 95 is provided in the bent end to permit that end to be readily severed from the heating plate 91 after the soldering operation. Still another connecting member 96 projects inwardly from the same edge as connecting member 94 and is provided with a score line 97 to facilitate separation of the distal portion of the connecting member from the plate member 91. Projecting from another leg of the U-shaped plate member 91 there is a connecting member 98 having a linear perforation extending transversely hereof to permit the distal end of that connecting member to be torn away from the plate member 91. Adjacent the connecting member 98, and projecting from the same edge of plate member 91, there is a connecting member 100 that projects downwardly from the plane of plate member 91 and then bends at a right angle so as to project inwardly of the U-shaped plate member in a plane parallel to the plate member. Thus, for example, if we assume that a printed circuit board on which connection sites are located has a thickness corresponding to the vertical spacing between the distal ends of connecting member 98 and connecting member 100, the two connecting members may serve to effect solder connections on opposite surfaces of the board. Connecting member 100 is provided with a score line 101 to permit separation of the distal end of that connecting member from plate 91.

Another connecting member 102 is illustrated as projecting inward of the U-shaped plate member 91 and co-planar with that plate member. Score line 103 permits connecting member 102 to be readily severed from the plate member. At the opposite edge of the same leg of plate member 91 there is a further connecting member 104 that extends downwardly from the plane of the plate member and then bends at a right angle to project inwardly at a location directly below connecting member 102. A score line 105 permits connecting member 104 to be readily separated from the plate member. Connecting members 102 and 104 are disposed in vertical alignment to provide solder connections on opposite surfaces of a printed circuit board.

Connecting member 106 extends from the outer edge of the U-shaped plate member and is provided with a notch 107 to permit it to be readily detached from the plate member.

A series circuit comprising an a.c. or d.c. power supply 108, a switch 109 and a potentiometer 110 is connected in series between opposite ends of the plate member 91. The voltage supply 108 provides a current through the plate member that is determined by the resistance of the plate member and the setting of potentiometer 110. The various connecting members 92, 94, 96, 98, 100, 102, 104 and 106 are inserted between respective pairs of contacts to be soldered and may contain predetermined amounts of solder to effect the necessary solder connections at the various connection sites. The arrangement illustrated in FIG. 11 is not as desirable as those described above in which self-regulating heaters are utilized to prevent overheating. Nevertheless, the illustrated resistance heater may be employed in conjunction with the severable connecting members that deliver thermal energy to various connection sites and remain permanent electrically conductive components of the resulting solder joints.

Figure 19:
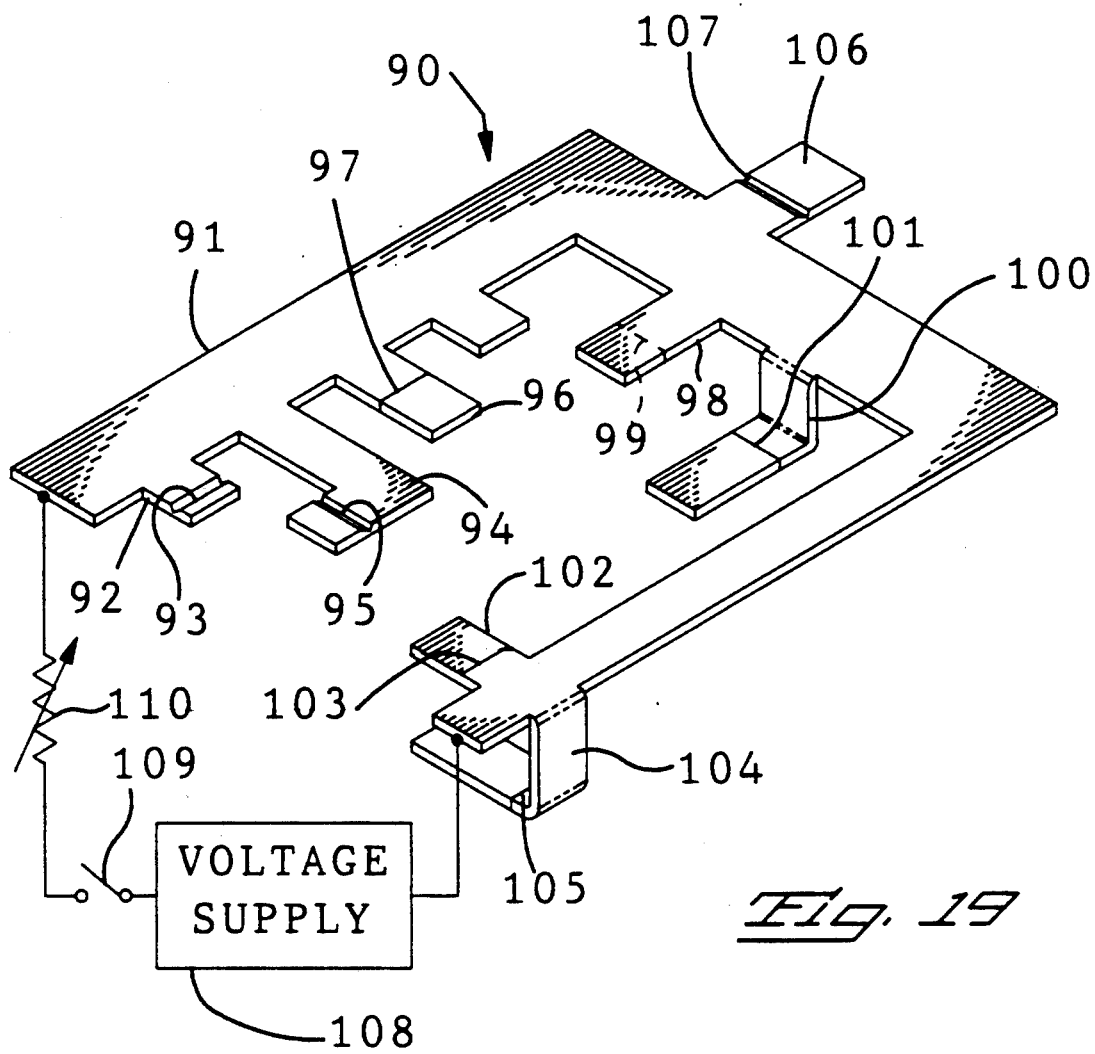
FIG. 19 is a view in perspective of an alternative form of heater assembly having severable connecting members projecting therefrom in accordance with the present invention.

It will be appreciated that the variety of types of connecting members illustrated in FIG. 19 (i.e., co-planar bends, out-of-plane bends, various spacing between members, various sizes and shapes of members, projections from different edges of the heater unit, etc.) are applicable to self-regulating heaters of the type described above.

In the descriptions of the various embodiments set forth above, the connecting members are said to be both electrically and thermally conductive. Thermal conduction permits the connecting members to conduct thermal energy directly from the heater body to respective connection sites. Electrical conductivity permits the connecting member to serve as an electrically-conductive bridge between the two members being joined at the connection site. In this regard it will be appreciated that the entire connecting member need not be electrically-conductive; that is, as long as a portion of the connecting member provides a current path through the contacts joined at the connection site, the remainder of the connecting member need not be electrically-conductive.

As previously noted, although the description set forth herein relates to pre-deposition of solder on the contacts and/or connecting members, materials other than solder may be employed. For example, several conductive adhesives and pastes are commercially available and are fabricated as suspensions of metal powder in a thermosetting plastic. The metal powders employed are typically silver, gold, copper and aluminum while the adhesive plastic is generally an epoxy-type resin. Fusion temperatures and characteristics for these materials are well known.

It will be understood by those skilled in the art that, for applications in which solder is utilized as the fusible material, it is normally necessary to employ an appropriate flux material for the purposes of wetting and cleansing the contacts. In employing the present invention the flux may be part of a mixture of solder and flux that is pre-deposited on the contacts or connecting members; or the flux may be applied separately at the time of soldering; or the solder-flux mixture, in the form of conventional creams, pastes or liquids, may be applied to the connection sites at the time of soldering.

One of the main advantages of the present invention is the substantial elimination of solder bridging between connection sires. The connecting members 15 significantly increase the volume between the printed circuit board and the external connections (e.g., the wires of a flexible etched cable). More particularly, the pressure exerted on the connection sites during a soldering operation tends to force molten solder into the void volume between connection sites whereas the surface tension of the molten solder tends to maintain the solder in contact with the contact pads. By increasing the volume by the thickness of the connecting members, the present invention reduces the pressure on the liquid solder, thereby preventing the solder from being forced across the gap between connection sites by hydraulic action.

From the foregoing description it will be appreciated that the invention makes available a novel method and apparatus for effecting solder connections, including multiple simultaneous solder connections particularly at connection sites located on a printed circuit board, wherein electrically and thermally conductive connecting members deliver thermal energy from a heater and remain permanent components of the soldered joints.

Having described preferred embodiments of a new and improved method and apparatus for soldering, it is believed that other modifications, variations and changes will be suggested to those skilled in the art in view of the teachings set forth herein. It is therefore to be understood that all such variations, modifications and changes are believed to fall within the scope of the present invention as defined by the appended claims.

We claim:

1. Apparatus for providing sufficient thermal energy to melt a fusible electrically conductive material and thereby provide electrically-conductive connections between contacts in a first plurality of spaced electrical contacts and respective contacts in a second plurality of similarly spaced electrical contacts, said apparatus comprising:

a selectively actuable heater body for supplying at least said sufficient thermal energy, said heater body comprising a substrate of an electrically-conductive first material having a relatively low electrical resistivity and relatively low magnetic permeability, said substrate having a first surface, and a skin layer of an electrically-conductive second material disposed on at least a portion of said first surface, said second material having a higher electrical resistivity than that of said first material, and having a magnetic permeability which at temperatures below its Curie temperature is substantially greater than said relatively low magnetic permeability and at temperatures above its Curie temperature is substantially the same as said relatively low magnetic permeability;

said apparatus further comprising a tooling means for selectively causing alternating current to flow to said heater body at a substantially fixed amplitude sufficient to heat said skin layer to its Curie temperature within a prescribed time interval and at a frequency such that the current in the region of said portion of said first surface is concentrated in said skin layer; and a plurality of spaced thermally-conductive connecting members secured to and in thermally-conductive contact with said heater body, the spacing between said connecting members corresponding substantially to the spacing between the contacts in said first plurality of contacts, each of said connecting members being adapted to be disposed in both electrical and thermal contact with and physically between a corresponding contact in said first plurality of contacts and a respective contact in said second plurality of contacts to transfer said sufficient thermal energy from said heater body to said corresponding and respective contacts, and to remain a permanent part of an electrically-conductive connection between said corresponding contact and said respective contact, said connecting members project from locations of said heater body proximate said portion of said first surface.

2. The apparatus according to claim 1 wherein each of said connecting members has a prescribed amount of said fusible material deposited thereon to be melted when said heater body is actuated.

3. The apparatus according to claim 1 wherein the Contacts in said first plurality of contacts are contact pads disposed on a circuit board, and wherein each of said contact pads has a prescribed amount of said fusible material deposited thereon.

4. The apparatus according to claim 1 wherein the contacts in said first plurality of contacts are contact pads disposed on a circuit board, and wherein the contacts in said second plurality of contacts are etched leads in a flexible etched cable.

5. The apparatus according to claim 1 wherein the contacts in said first plurality of contacts are contact pads disposed on a printed circuit board, and wherein the contacts in said second plurality of contacts are leads in a ribbon cable.

6. The apparatus according to claim 1 wherein the contacts in said first plurality of contacts are contact pads disposed in a printed circuit board, and wherein the contacts in said second plurality of contacts are solder tails extending from a connector housing to be mounted on said printed circuit board.

7. The apparatus according to claim 1 wherein said connecting members are foil strips of insufficient rigidity to preclude their longitudinal collapse due to their own weight.

8. The apparatus according to claim 1 wherein said first material comprises copper.

9. The apparatus according to claim 1 wherein said second material comprises iron.

10. The apparatus according to claim 1 wherein said second material comprises nickel.

11. The apparatus according to claim 1 wherein said tooling means comprises a current return path and source means for selectively passing said alternating current through said heater body and said current return path.

12. The apparatus according to claim 11 wherein said current return path includes a return bus and electrically conductive means connecting said heater body to said return bus, said apparatus further comprising a layer of electrically-insulative material disposed between and in flush abutting contact with said skin layer and said return bus.

13. The apparatus according to claim 12 wherein, said return bus and said layer of insulative material are permanently affixed to the heater body with said layer of insulative material flush against said skin layer.

14. The apparatus according to claim 12 wherein said return bus and said layer of insulative material are selectively movable into and out of contact with said heater body.

15. The apparatus according to claim 1 wherein said connecting members are finger-like projection readily severable from said heater body.

16. The apparatus according to claim 15 wherein said finger-like projections are foil strips of insufficient rigidity to preclude their longitudinal collapse due to their own weight.

17. The apparatus according to claim 1 wherein said connecting members extend from said heater body in at least two different directions.

18. The apparatus according to claim 1 further comprising a member permanently bent in at least one dimension.

19. The apparatus according to claim 1 wherein said substrate includes a second surface opposite said first surface, said heater body further comprising a second skin layer of said electrically-conductive second material disposed on at least a portion of said second surface.

20. The apparatus according to claim 1 wherein said tooling means includes means for magnetically inducing said alternating current as eddy currents in said heater body.

21. The apparatus according to claim 1 wherein said current return path includes:
a second heater body comprising:
a second substrate of said electrically-conductive first material, said second substrate having a first surface;
a second thin layer of said second material disposed on at least a portion of the first surface of said second substrate; and
electrically-conductive means connecting said first and second heater bodies in series;
said apparatus further comprising a layer of electrically insulative material disposed between and in contact with said first and second thin layers.

22. Apparatus for providing sufficient thermal energy to melt a fusible electrically conductive material and thereby provide electrically-conductive connections between contacts in a first plurality of spaced electrical contacts and respective contacts in a second plurality of similarly spaced electrical contacts, said apparatus comprising:
a selectively actuable heater body for supplying at least said sufficient thermal energy, said heater body comprising a substrate of an electrically-conductive first material having a relatively low electrical resistivity and relatively low magnetic permeability, said substrate having a first surface, and a skin layer of an electrically-conductive second material disposed on at least a portion of said first surface, said second material having a higher electrical resistivity than that of said first material, and having a magnetic permeability which at temperatures below its Curie temperature is substantially greater than said relatively low magnetic permeability and at temperatures above its Curie temperature is substantially the same as said relatively low magnetic permeability;
said apparatus further comprising a tooling means for selectively causing alternating current to flow to said heater body at a substantially fixed amplitude sufficient to heat said skin layer to its Curie temperature within a prescribed time interval and at a frequency such that the current in the region of said portion of said first surface is concentrated in said skin layer; and
a plurality of spaced thermally-conductive connecting members secured to and in thermally-conductive contact with said heater body, the spacing between said connecting members corresponding substantially to the spacing between the contacts in said first plurality of contacts, each of said connecting members being adapted to be disposed in both electrical and thermal contact with an physically between a corresponding contact in said first plurality of contacts and a respective contact in said second plurality of contacts to transfer said sufficient thermal energy from said heater body to said corresponding and respective contacts, and to remain a permanent part of an electrically-conductive connection between said corresponding contact and said respective contact, said connecting members project from locations of said heater body proximate said portion of said first surface, said connecting members are finger-like projections each including a transversely-extending portion of reduced thickness to facilitate severing of the projection from said heater body, said transversely-extending portions being co-linearly aligned.

23. Apparatus for providing sufficient thermal energy to melt a fusible electrically conductive material and thereby provide electrically-conductive connections between contacts in a first plurality of spaced electrical contacts and respective contacts in a second plurality of similarly spaced electrical contacts, said apparatus comprising:
a selectively actuable heater body for supplying at least said sufficient thermal energy, said heater body comprising a substrate of an electrically-conductive first material having a relatively low electrical resistivity and relatively low magnetic permeability, said substrate having a first surface, and a skin layer of an electrically-conductive second material disposed on at least a portion of said first surface, said second material having a higher electrical resistivity than that of said first material, and having a magnetic permeability which at temperatures below its Curie temperature is substantially greater than said relatively low magnetic permeability and at temperatures above its Curie temperature is substantially the same as said relatively low magnetic permeability;
said apparatus further comprising a tooling means for selectively causing alternating current to flow to said heater body at a substantially fixed amplitude sufficient to heat said skin layer to its Curie temperature within a prescribed time interval and at a frequency such that the current in the region of said portion of said first surface is concentrated in said skin layer; and a plurality of spaced thermally-conductive connecting members secured to and in thermally-conductive contact with said heater body, the spacing between said connecting members corresponding substantially to the spacing between the contacts in said first plurality of contacts, each of said connecting members being adapted to be disposed in both electrical and thermal contact with an physically between a corresponding contact in said fist plurality of contacts and a respective contact in said second plurality of contacts to transfer said sufficient thermal energy from said heater body to said corresponding and respective contacts, and to remain a permanent part of an electrically-conductive connection between said corresponding contact and said respective contact, said connecting members project from locations of said heater body proximate said portion of said first surface, said connecting members are finger-like projections each including a transversely-extending perforated portion to facilitate severing of the projection from said heater body.

24. Apparatus for providing sufficient thermal energy to melt a fusible electrically-conductive material and thereby provide electrically-conductive connection between contacts in a first plurality of spaced electrical contacts and respective contacts in a second plurality of similarly spaced electrical contacts, said apparatus comprising:

a selectively actuable heater body for supplying at least said sufficient thermal energy, said heater body comprising a substrate of an electrically-conductive first material having a relatively low electrical resistivity and relatively low magnetic permeability, said substrate having a first surface, and a skin layer of an electrically-conductive second material disposed on at least a portion of said first surface, said second ;material having a higher electrical resistivity than that of said first material, and having a magnetic permeability which at temperatures below its Curie temperature is substantially greater than said relatively low magnetic permeability and at temperatures above its Curie temperature is substantially the same as said relatively low magnetic permeability;

said apparatus further comprising a tooling means for selectively causing alternating current to flow to said heater body at a substantially fixed amplitude sufficient to heat said skin layer to its Curie temperature within a prescribed time interval and at a frequency such that the current in the region of said portion of said first surface is concentrated in said skin layer; and a plurality of spaced thermally-conductive connecting member secured to and in thermally-conductive contact with said heater body, the spacing between said connecting members corresponding substantially to the spacing between the contacts in said first plurality of contacts, each of said connecting members being adapted to be disposed in both electrical and thermal contact with an physically between a corresponding contact in said first plurality of contacts and a respective contact in said second plurality of contacts to transfer said sufficient thermal energy from said heater body to said corresponding and respective contacts, and to remain a permanent part of an electrically-conductive connection between said corresponding contact and said respective contact, said connecting members project from locations of said heater body proximate said portion of said first surface, said connecting members are finger-like projections of sufficient rigidity to preclude their flexure due to their own weight when suspended in cantilever fashion.

25. Apparatus for providing sufficient thermal energy to melt a fusible electrically conductive material and thereby provide electrically-conductive connections between contacts in a first plurality of spaced electrical contacts and respective contacts in a second plurality of similarly spaced electrical contacts, said apparatus comprising:

a selectively actuable heater body for supplying at least said sufficient thermal energy, said heater body comprising a substrate of an electrically-conductive first material having a relatively low electrical resistivity and relatively low magnetic permeability, said substrate having first and second surfaces;

first and second skin layers of an electrically-conductive second material disposed on at least respective portions of each of said first and second surfaces, respectively, said second material having a higher electrical resistivity than that of said first material, and having a magnetic permeability which at temperatures below its Curie temperature is substantially greater than said relatively low magnetic permeability and at temperatures above its Curie temperature substantially the same as said relatively low magnetic permeability;

a plurality of spaced thermally-conductive connecting members secured to and in thermally-conductive contact with s said heater body, the spacing between said connecting members corresponding substantially to the spacing between the contacts in said first plurality of contacts, each of said connecting members being adapted to be disposed in both electrical and thermal contact with and physically between a corresponding contact in said first plurality of contacts and a respective contact in said second plurality of contacts to transfer said sufficient thermal energy from said heater body to said corresponding and respective contacts, and to remain a permanent part of an electrically-conductive connection between said corresponding contact and said respective contact;

said apparatus further comprising means for selectively causing alternating current to flow in said heater body at a substantially fixed amplitude sufficient to heat said first and second skin layers to their Curie temperature within a prescribed time interval and at a frequency such that the current in the region of said portions of said first and second surfaces is concentrated in said first and second skin layers, respectively, said means comprising a current return path and source means for selectively passing said alternating current through said heater body and said current return path.

26. A method for providing electrically-conductive connections between contacts in a first plurality of spaced electrical contacts and respective contacts in a second plurality of similarly spaced electrical contacts at a respective plurality of connection sites, said method comprising the steps of:

disposing a plurality of connecting members at a respective connection sites in abutting relation with a respective contact in said first plurality of contacts and a respective contact in said second plurality of contacts, each of said connecting members projects from and is in thermally-conductive contact with a heater body having a substrate of an electrically-conductive first material having relatively low electrical resistivity and magnetic permeability, and a skin layer of second material having a very much higher magnetic permeability at temperatures below its Curie temperature and a greater electrical resistivity than that of said first material;

delivering thermal energy to said connection sites via said connecting members to melt fusible electrically-conductive material at each connection site by flowing an alternating current of fixed amplitude in said heater body such that: (a) for heater body temperatures below the Curie temperature of said second material the current is substantially concentrated in said skin layer; and (b) for heater body temperatures above said Curie temperature the current is distributed to a substantially greater extent in said substrate; and removing the thermal energy from the concentration sites to permit the fusible material to harden and secure said first and second pluralities of contacts to said plurality of connecting members whereby each connecting member remains a permanent part of a respective electrically-conductive connection at a respective connection site.

27. The method according to claim 26 further comprising the step of severing said connecting members from said heater body after said fusible material has melted and then solidified.

28. The method according to claim 26 wherein the step of flowing an alternating current comprises magnetically inducing the alternating current as eddy currents in said heater body.

29. The method according to claim 28 further comprising the steps of:

selectively moving a separable tooling member into juxtaposed position with said heater body such that current flowing through said tooling member magnetically induces said alternating current in said heater body; and selectively passing primary a.c. current through said tooling member.

30. The method according to claim 26 wherein said step of flowing an alternating current includes passing the alternating current from a source through the heater body and a return path.

31. The method according to claim 30 wherein said return path is part of a movable tooling apparatus, and further comprising the step of selectively moving said tooling apparatus into and out of physical contact with said heater body.

32. The method according to claim 30 wherein the step of passing an alternating current includes establishing an electrical field in a direction transverse to current flow through said heater body to concentrate the current in said skin layer for heater body temperatures below the Curie temperature of said second material.

33. Apparatus for providing sufficient thermal energy to melt a fusible conductive material and thereby provide an electrically-conductive connection between a first electrical contact and a second electrical contact, said apparatus comprising:

a selectively actuable heater body for supplying at least said sufficient thermal energy, said heater body comprising a substrate of an electrically-conductive first material having a relatively low electrical resistivity and relatively low magnetic permeability, said substrate having a first surface, and a skin layer of an electrically-conductive second material disposed on at least a portion of said first surface, said second material having a higher electrical resistivity than that of said first material, and having a magnetic permeability which at temperatures below its Curie temperature is substantially greater than said relatively low magnetic permeability and at temperatures above its Curie temperature is substantially the same as said relatively low magnetic permeability;

a thermally-conductive connecting member secured to and in thermally-conductive contact with said heater body and adapted to be disposed in both electrical and thermal contact with an physically between said first contact and said second contact to transfer said sufficient thermal energy to said first and second contacts from said heater body and to remain a permanent part of the electrically-conductive connection between the first and second contacts; and said apparatus further comprising means for selectively causing alternating current to flow in said heater body at a substantially to its Curie temperature within a prescribed time interval and at a frequency such that the current in the region of said portion of said first surface is concentrated in said skin layer.

34. The apparatus according to claim 33 wherein said means comprises tooling means including means for magnetically inducing said alternating current in said heater body as eddy currents.

35. The apparatus according to claim 33 wherein said means comprises a current return path and source means for selectively passing the alternating current through said heater body and said current return path.

36. The apparatus according to claim 33 further comprising means for selectively severing said connecting members from said heater body.

37. The apparatus according to claim 33 wherein said heater body and said connecting member both remain a permanent part of said electrically-conductive connection between the first and second contacts.

38. The apparatus according to claim 33 further comprising a member permanently bent in at least one dimension.

39. The apparatus according to claim 33, wherein a said connecting member is a finger-like projection readily severably from said heater body.

40. The apparatus according to claim 39 wherein said finger-like projection is a foil strip of insufficient rigidity to preclude longitudinal collapse due to the weight of said projection.

41. The apparatus according to claim 33 wherein said substrate includes a second surface opposite said first surface, said heater body further comprising a second skin layer of said electrically-conductive second material disposed on at least a portion of said second surface.

42. The apparatus according to claim 33 wherein said tooling ;means includes means for magnetically inducing said alternating current as eddy current in said heater body.

43. The apparatus according to claim 33 wherein said current return path includes:
 a second heater body comprising:
  a second substrate of said electrically-conductive first material, said second substrate having a first surface;
  a second thin layer of said second material disposed on at least a portion of the first surface of said second substrate; and
  electrically-conductive means connecting said first and second heater bodies in series;
 said apparatus further comprising a layer of electrically insulative material disposed between and in contact with said first and second thin layers.

44. A method for securing first and second electrical contacts in electrically-conductive relation at a connection site comprising the steps of:
 disposing a connecting member in abutting relation with each of said first and second contacts at the connection site, said connecting member projects from and is in thermally-conductive contact with a heater body having a substrate of an electrically-conductive first material with a relatively low electrical resistivity and magnetic permeability, and a skin layer of a second material with a very much higher magnetic permeability at temperatures below its Curie temperature and a greater electrical resistivity than that of said first material;
 delivering thermal energy to the connection site via said connecting member to melt fusible electrically-conductive material at the connection site by flowing an alternating current of fixed amplitude through said heater body such that: (a) for heater body temperatures below the Curie temperature of said second material the current is substantially concentrated in said skin layer; and (b) for heater body temperatures above said Curie temperature the current is distributed to a substantially greater extent in said substrate; and
 permitting the fusible material at the connection site to solidify and to secure said first and second contacts to said connecting member whereby the connecting member remains secured to the first and second contact members at the connection site.

45. The method according to claim 44 wherein the step of flowing an alternating current comprises magnetically inducing the alternating current as eddy currents in said heater body.

46. The method according to claim 45 further comprising the steps of:
 selectively moving a separable tooling member into juxtaposed position with said heater body such that current flowing through said tooling member magnetically induces said alternating current in said heater body; and
 selectively passing primary a.c. current through said tooling member.

47. The method according to claim 44 wherein said step of flowing an alternating current includes passing the alternating current from a source through the heater body and a return path.

48. The method according to claim 47 wherein said return path is part of a movable tooling apparatus, and further comprising the step of selectively moving said tooling apparatus into and out of physical contact with said heater body.

49. The method according to claim 47 wherein the step of passing an alternating current includes establishing an electrical field in a direction transverse to current flow through said heater body to concentrate the current in said skin layer for heater body temperatures below the Curie temperature of said second material.

* * * * *

UNITED STATES PATENT AND TRADEMARK OFFICE
CERTIFICATE OF CORRECTION

PATENT NO. : 5,059,756

DATED : October 22, 1991

INVENTOR(S) : Homer Henschen, et. al.

It is certified that error appears in the above-identified patent and that said Letters Patent is hereby corrected as shown below:

On the Title page,

Item 75 (Inventors), please replace "Henschenp" with "Henschen".

In Claim 3, column 18, line 35, please replace "Contacts" with --contacts--.

In Claim 23, column 21, line 12, please replace "fist" with --first--.

In Claim 24, column 24, line 41, please replace ";material" with --material--.

In Claim 25, column 22, line 38, please delete "s" between the words "with" and "said".

In Claim 26, column 23, line 3, please delete "a", second occurrence.

In Claim 33, column 24, line 32, after "substantially", please insert --fixed amplitude sufficient to heat said skin layer--.

UNITED STATES PATENT AND TRADEMARK OFFICE
CERTIFICATE OF CORRECTION

PATENT NO. : 5,059,756

DATED : October 22, 1991

INVENTOR(S) : Homer Henschen, et. al.

It is certified that error appears in the above-identified patent and that said Letters Patent is hereby corrected as shown below:

In Claim 42, column 24, line 68, please replace ";means" with --mean--.

Signed and Sealed this

Twenty-fifth Day of May, 1993

Attest:

MICHAEL K. KIRK

*Attesting Officer*      Acting Commissioner of Patents and Trademarks